(12) United States Patent
Leipold et al.

(10) Patent No.: US 10,284,178 B2
(45) Date of Patent: May 7, 2019

(54) BAW/SAW-ASSISTED LC FILTERS AND MULTIPLEXERS

(71) Applicant: Qorvo US, Inc., Greensboro, NC (US)

(72) Inventors: Dirk Robert Walter Leipold, San Jose, CA (US); George Maxim, Saratoga, CA (US); Marcus Granger-Jones, Scotts Valley, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/449,357

(22) Filed: Mar. 3, 2017

(65) Prior Publication Data

US 2017/0257078 A1    Sep. 7, 2017

Related U.S. Application Data

(60) Provisional application No. 62/303,340, filed on Mar. 3, 2016.

(51) Int. Cl.
| | | |
|---|---|---|
| H03H 9/70 | (2006.01) | |
| H03H 9/72 | (2006.01) | |
| H03H 7/09 | (2006.01) | |
| H03H 9/54 | (2006.01) | |
| H03H 9/60 | (2006.01) | |
| H03H 9/64 | (2006.01) | |
| H03H 7/01 | (2006.01) | |

(52) U.S. Cl.
CPC ............. *H03H 9/703* (2013.01); *H03H 7/09* (2013.01); *H03H 7/1775* (2013.01); *H03H 9/542* (2013.01); *H03H 9/605* (2013.01); *H03H 9/6483* (2013.01); *H03H 9/72* (2013.01)

(58) Field of Classification Search
CPC ......... H03H 9/703; H03H 7/0115; H03H 9/72
USPC .......................................................... 333/133
See application file for complete search history.

(56) References Cited

U.S. PATENT DOCUMENTS

| | | | |
|---|---|---|---|
| 2007/0030094 A1* | 2/2007 | Omote | ............... H03H 9/02559 333/133 |
| 2016/0294423 A1* | 10/2016 | Yatsenko | ............. H04B 1/1036 |
| 2017/0294896 A1* | 10/2017 | Nosaka | ..................... H03H 9/64 |

* cited by examiner

*Primary Examiner* — Benny T Lee
*Assistant Examiner* — Hafizur Rahman
(74) *Attorney, Agent, or Firm* — Withrow & Terranova, P.L.L.C.

(57) ABSTRACT

Embodiments of radio frequency (RF) filtering circuitry are disclosed. In one embodiment, the RF filtering circuitry includes a common port, a second port, a third port, a first RF filter path, and a second RF filter path. The first RF filter path is connected between the common port and the second port and comprises a first pair of resonators and a first acoustic wave resonator. One of the first pair of resonators also includes a second acoustic wave resonator. The second RF filter path is connected between the common port and the third port. The second RF filter path includes a second pair of resonators. The first and second acoustic wave resonators of the first RF filter path increase roll-off greatly with respect to just an LC filter, and thereby allow for an increase out-of-band rejection at high frequency ranges.

19 Claims, 13 Drawing Sheets

BAW/SAW-ASSISTED LC FILTERS AND MULTIPLEXERS

RELATED APPLICATIONS

This application claims the benefit of provisional patent application Ser. No. 62/303,340, filed Mar. 3, 2016 the disclosure of which is hereby incorporated herein by reference in its entirety.

FIELD OF THE DISCLOSURE

This disclosure relates generally to radio frequency (RF) filtering circuitry and methods of operating the same.

BACKGROUND

Radio frequency (RF) filtering circuitry often includes multiple RF filter paths, each providing different passbands tuned within different RF communication bands so that RF signals operating within the different RF communication bands can be routed to the appropriate downstream circuitry. In order to prevent RF filter paths having passbands tuned to adjacent RF communication bands from interfering with one another (particularly when RF communication bands are close to one another), the roll-off of the passband often needs to be increased so as to increase out-of-band rejection. This is typically done by using filtering components that create a notch adjacent to the passband, thereby increasing the roll-off of the passband and out-of-band rejection. Unfortunately, typical techniques (such as LC notch filters) for creating these notches typically load the RF filter paths within their respective passbands and can create notches with excessive flyback. For passbands at high frequency ranges, the roll-off provided by LC filters is typically not enough to provide adequate isolation between passbands that are close together (with approximately 100 MHz or less) and in high frequency ranges (frequency ranges with frequencies greater than 1 GHz). Thus, it is desirable to provide RF filtering circuitry that can increase out-of-band rejection at high frequency ranges.

SUMMARY

Embodiments of radio frequency (RF) filtering circuitry are disclosed. In one embodiment, the RF filtering circuitry includes a common port, a second port, a third port, a first RF filter path, and a second RF filter path. The first RF filter path is connected between the common port and the second port, and comprises a first pair of resonators and a first acoustic wave resonator. One of the first pair of resonators also includes a second acoustic wave resonator. The second RF filter path is connected between the common port and the third port, and includes a second pair of resonators. The first and second acoustic wave resonators of the first RF filter path increase roll-off greatly with respect to just an LC filter, and thereby allow for an increase in out-of-band rejection at high frequency ranges.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
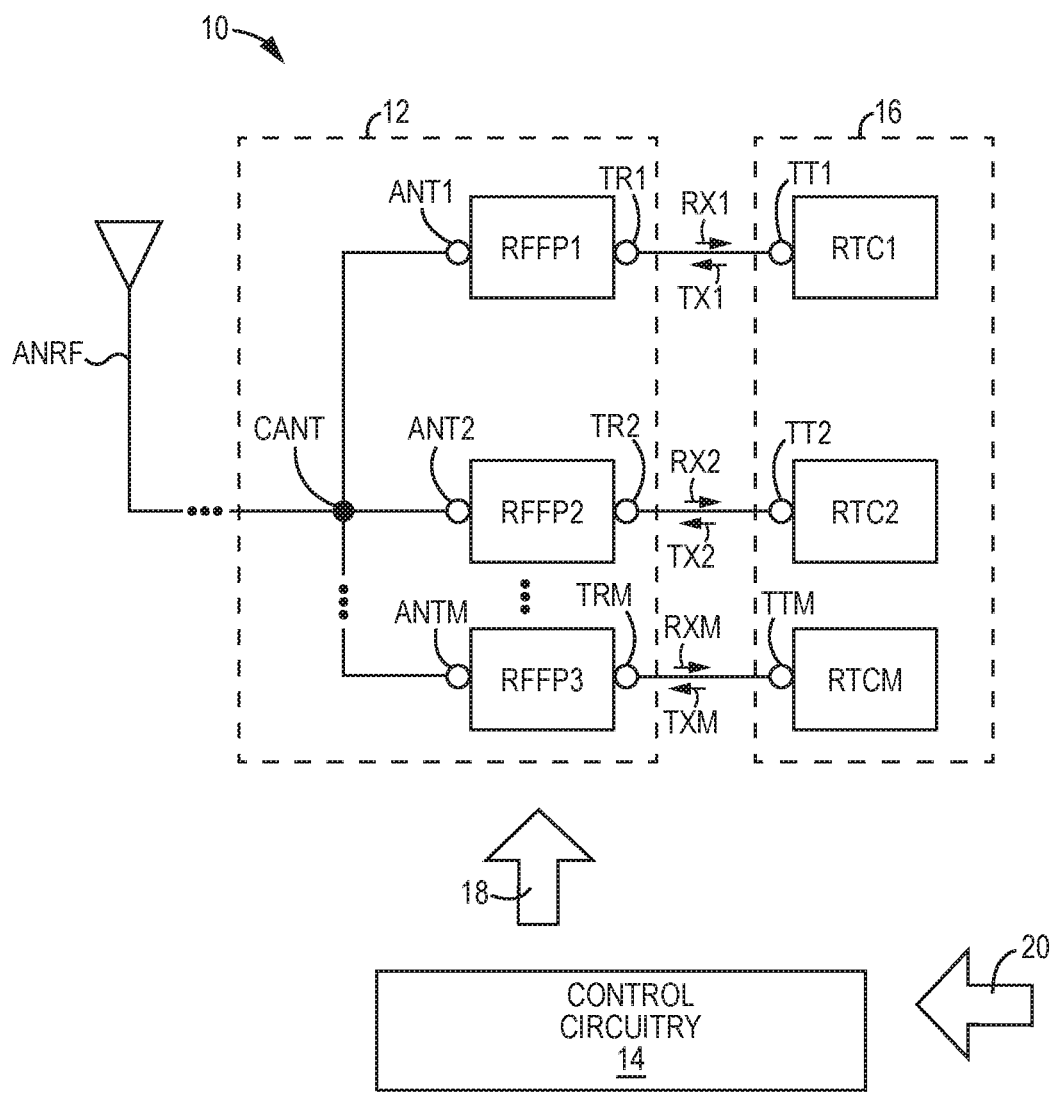
FIG. 1 illustrates RF front end circuitry that includes a generalized RF filter structure with an RF filter path providing RF multiplexing.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates exemplary RF front end circuitry 10 that may be employed in an RF front end communication circuit of a portable communication device, such as a cell phone, a tablet, a laptop, and/or the like. The RF front end circuitry 10 includes an exemplary RF filter structure 12 and control circuitry 14. The RF filter structure 12 includes ports (referred to generically or generally as ports TR and specifically as ports TR1-TRM) which are connected to RF transceiver circuitry 16. In addition, the RF filter structure 12 includes a ports (referred to generically or generally as ports ANT and specifically as ports ANT1-ANTM) which are connected to common node CANT. In this embodiment, each of the ports ANT is directly connected to the common node CANT. The common node CANT is coupled to an antenna ANRF. The RF filter structure 12 also includes RF filter paths RFFP (referred to generically or generally as RF filter paths RFFP and specifically as RF filter paths RFFP1-RFFPM) that each include a different corresponding one of the ports TR and a different one of the ports ANT. Accordingly, each individual one of the RF filter paths RFFP provided in the RF filter structure 12 shown in FIG. 1 is identified with an integer variable m, such that m has a domain of integer variables of every integer between ($1<=m>=M$). M is an integer value equal to the total integer number of RF filter paths RFFP and must be equal to or greater than 2. Thus, there are at least two RF filter paths RFFP in the RF filter structure 12.

The RF transceiver circuitry 16 may include RF transmit chains (not expressly shown) that can generate any number of RF transmit signals. In the embodiment shown in FIG. 1, the RF transmit signals are referred to generically or generally as RF transmit signals TX and individually as RF transmit signal TX1-TXM). Additionally, each of the RF transmits signals TX1-TX2M may be provided in different RF communication bands for transmission by a different corresponding port ANT1-ANTM.

Additionally, the RF transceiver circuitry 16 may include RF receive chains (not expressly shown) that are configured to process any number of RF receive signals, (referred to generically or generally as RF receive signals RX1, RX1-RXM), after reception by the antenna ANRF. The RF receive chains may include low noise amplifiers (e.g., LNA1-LNAM, not shown) that are each used to amplify a different corresponding one of the RF receive signals RX1-RXM. In this embodiment, the RF receive signals RX1 and the RF receive signals RX2 are provided in different RF communication bands. Also, each of the RF receive signals RX1-RX1M may be provided in different RF communication bands when received by the corresponding port ANT1-ANTM. The RF transceiver circuitry 16 includes RF transceiver chains (referred to generically or generally as RF transceiver chains RTC and specifically as RF transceiver chains RTC1-RTCM). The RF transceiver circuitry 16 also includes transceiver ports (referred to generically or generally as transceiver ports TT and specifically as transceiver ports TT1-TTM).

For each integer value of the integer variable m between 1 to M, the tunable RF filter paths RFFPm define a passband so that the RF transmit signal TXm and the RF receive signal RXm can be routed and filtered between the port TRm and a port ANTm. The port ANTm is directly connected to the common node CANT. The port TRm is connected to the transceiver port TTm, and the transceiver port TTm is connected to the RF transceiver chain RTCm. The RF transmit signal TXm is generated by a transmit chain in the RF transceiver chain RTCm and is output by the RF transceiver chain RTCm at the port TTm. The RF transmit signal TXm then propagates into the port TR1. Since the passband of the RF filter path RFFPm includes a transmit channel of the RF transmit signal TXm, the RF transmit signal TXm propagates though the RF filter path RFFPm from the port TRm to the port ANTm. The transmit signal TXm then propagates out of the port ANTm to the common node CANT. The transmit signal TXm then propagates from the common node CANT to the antenna ANRF. The antenna ANRF thereby emits the RF transmit signal TXm wirelessly.

Accordingly, the RF transmit signal TXm is output from the port ANTm and is transmitted to the antenna ANRF. Also, the RF transmit signal TXm is input from the port TRm and is transmitted to the RF transceiver chain RTCm. The RF transceiver chain RTCm has the transmit chain configured to generate the RF transmit signal TXm.

The RF receive signal RXm is received wirelessly by the antenna ANRF. The RF receive signal RXm propagates from the antenna ANRF to the common node CANT. Since the passband of the RF filter path RFFPm includes a receive channel of the RF receive signal RXm, the RF receive signal RXm propagates from the common node CANT to the port ANTm. The RF receive signal RXm then propagates through the RF filter path RFFPm from the port ANTm to the port TRm. The RF receive signal RXm then propagates out of the port TRm to the port TTm. The RF transceiver chain RTCm receives the RF receive signal RXm from the port TTm. More specifically, a receive chain in the RF transceiver chain RTCm receives the RF receive signal RXm from the port TTm. The receive chain in the RF transceiver chain RTCm is configured to process (e.g., demodulate) the RF receive signal RXm within the receive channel of the RF receive signal RXm.

Accordingly, the RF receive signal RXm is output at the port TRm wherein the RF receive signal RXm is processed by a receive chain in the RF transceiver chain RTCm. Also, the RF receive signal RXm is input at the port TRm, wherein the RF receive signal RXm propagates from the antenna ANRF to the common node CANT and into the port ANTm. In this embodiment, the passband defined by the RF filter path RFFPm is unaligned with the passbands defined by every other RF filter path RFFP (i.e., every integer value of other passbands of every other RF filter path RFFP that is not the RF filter path RFFPm). This is because the communication band of the RF receive signal RXm and the RF transmit signal TXm is different than every other communication band of every other RF receive signal RX and every other RF transmit signal TX (i.e., every other communication band of every RF receive signal RX that is not the RF receive signal RXm, and every RF transmit signal TX that is not the RF transmit signal TXm).

Accordingly, the RF filter structure 12 is configured to provide a multiplexing functionality between the antenna ANRF and the RF transceiver chains RTC. In this manner, the RF transmit signals TX and the RF receive signals RX are routed as described above by the RF filter structure 12 to the RF transceiver circuitry 16.

In order to tune the tunable RF filter paths RFFP, the control circuitry 14 is configured to generate a control output 18. The control output 18 may include one or more control signals, including analog signals and groups of digital signals, in order to tune the RF filter paths RFFP in the RF filter structure 12. The control circuitry 14 may also receive a control input 20 that includes one or more control signals, including analog signals and groups of digital signals. The control input 20 may include information for tuning the RF filter structure 12, such as information indicating RF communication bands, target parameters, power control information, and/or the like. The control circuitry 14 may tune the tunable RF filter paths in the RF filter structure 12 in accordance with the information provided by the control input 20.

Figure 2:
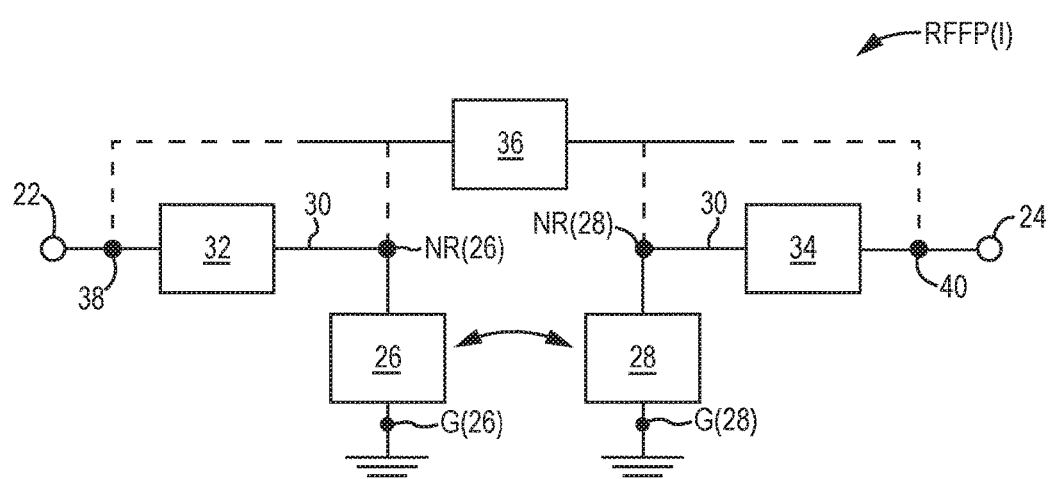
FIG. 2 illustrates a generalized embodiment that describes one class of the RF filter paths that may be utilized in the RF filter structure shown in FIG. 1.

FIG. 2 illustrates an exemplary RF filter path RFFP(I) that describes a class of RF filter paths, such that one or more of the RF filter path RFFP1-RFFPM shown in FIG. 1 may be members of the class of RF filter paths. One or more of the RFFP1-RFFPM shown in FIG. 1 may be provided in accordance with the RF filter path RFFP(I) shown in FIG. 2. The RF filter path RFFP(I) is connected between the port 22 and the port 24. The RF filter path RFFP(I) has at least a pair of resonators 26, 28. In some embodiments, the resonators 26, 28 are weakly coupled to one another.

As shown in FIG. 2, the RF filter path RFFP(I) has a main branch 30 that extends from the port 22 to the port 24. The RF filter path RFFP(I) also includes sub-branches coming off the main branch 30. As explained in further detail below, the filtering components in the main branch 30 and in the sub-branches coming off the main branch provide the desired response characteristics of the RF filter path RFFP(I). To provide the roll-off necessary to create the passband within the transfer response between the port 22 and the port 24, the RF filter path RFFP(I) provides the resonator 26 and the resonator 28, both connected in shunt with respect to the RF filter path RFFP(I). In this embodiment, the resonator 26 is connected between a node NR(26) in the main branch 30 and a grounded node G(26) connected to ground. Accordingly, the resonator 26 is connected in shunt to the main branch 30 at node NR(26). The node NR(26) is provided in the main branch 30. Also in this embodiment, the resonator 28 is connected between a node NR(28) in the main branch 30 and a grounded node G(28) connected to ground. Accordingly, the resonator 28 is connected in shunt to the main branch 30 at node NR(28). The resonators 26, 28 in the RF filter path RFFP(I) are configured such that a transfer response defines a passband. In this manner, RF signals that operate in frequency ranges within the passband propagate through the RF filter path RFFP(I) between the port 22 and the port 24.

The RF filter path RFFP(I) has a transfer response that is defined between the port 22 and the port 24. More specifically, the resonators 26, 28 in the RF filter path RFFP(I) are configured such that a transfer response defines the passband. As shown in FIG. 2, the RF filter path RFFP(I) includes a matching network 32 that is connected within the main branch 30 between the port 22 and the node NR(26). The matching network 32 is configured to provide an impedance transformation that provides impedance matching at the port 22 as explained in further detail below. The resonator 26 is configured to resonate at a frequency within the passband of the transfer response. In this manner, RF signals that operate in frequency ranges within the passband propagate through the RF filter path RFFP(I) between the port 22 and the port 24.

The RF filter path RFFP(I) also includes a matching network 34 that is connected within the main branch 30 between the node NR(28) and the port 24. The matching network 34 is configured to provide an impedance transformation that provides impedance matching at the port 24 as explained in further detail below. The resonator 28 is configured to resonate at a second frequency within the passband of the transfer response. In this manner, RF signals that operate in frequency ranges within the passband propagate through the RF filter path RFFP(I) between the port 22 and the port 24.

The RF filter path RFFP(I) includes a notch network 36 coupled to the main branch 30 of the RF filter path RFFP(I). The notch network 36 is configured to define the stopband within the passband of the transfer response without substantially increasing ripple variation of the passband defined by the transfer response. Accordingly, although the notch network 36 is coupled to the RF filter path RFFP(I), the passband of the transfer response between the port 22 and the port 24 is not substantially affected by the notch network 36. Thus, the notch network 36 is sufficiently isolated from the resonators 26, 28 so that interaction between the notch network 36 and the resonators 26, 28 does not increase variation within the passband.

More specifically, loading of the RF filter path RFFP(I) by the notch network 36 is so low that substantial rippling is not substantially created or substantially increased by the notch network 36. Thus, insertion losses introduced by the notch network 36 between the port 22 and the port 24 are relatively small and constant within the passband of the transfer response. Nevertheless, by providing the stopband adjacent to the passband of the transfer response, the notch network 36 sharpens the passband by increasing roll-off of the passband to the stopband.

In FIG. 2, the notch network 36 is illustrated in two exemplary arrangements with respect to the RF filter path RFFP(I). In one exemplary arrangement, the notch network 36 is also connected between the port 22 and the port 24. More specifically, the notch network 36 is connected in parallel to the RF filter path RFFP(I) with respect to the port 22 and the port 24. In this embodiment, the notch network 36 is coupled to the resonator 26 by being directly connected to a connection node 38 in the main branch 30 and/or by being directly connected to the node NR(26) in the main branch 30. The connection node 38 is provided in the main branch 30 between the port 22 and the matching network 32. Also, in this embodiment, the notch network 36 is coupled to the resonator 28 by being directly connected to a connection node 40 in the main branch 30 and/or by being directly connected to the node NR(28) in the main branch 30. The connection node 40 is provided in the main branch 30 between the matching network 34 and the port 24.

In the exemplary arrangement, the notch network 36 is also connected to the connection node 38 and to the connection node 40 so as to be in parallel with the RF filter path RFFP(I). Additionally in this exemplary arrangement, the notch network 36 is configured to dissipate RF signals within the stopband of the transfer response, and thereby prevent RF signals within the stopband from propagating between the port 22 and the port 24 or through the RF filter path RFFP(I). Dissipating the RF signals usually moderates the depth of the stopband and reduces flyback, thereby ensuring more isolation with respect to the passband and RF communication bands outside the stopband. The notch network 36 also increases roll-off necessary to create the passband within the transfer response between the port 22 and the port 24 so that the passband is isolated from the passband of other RF filter paths. To provide the roll-off necessary to create the passband within the transfer response between the port 22 and the port 24, the RF filter path RFFP(I) provides the resonator 26 and the resonator 28, both connected in shunt with respect to the RF filter path RFFP (I).

Figure 3A:
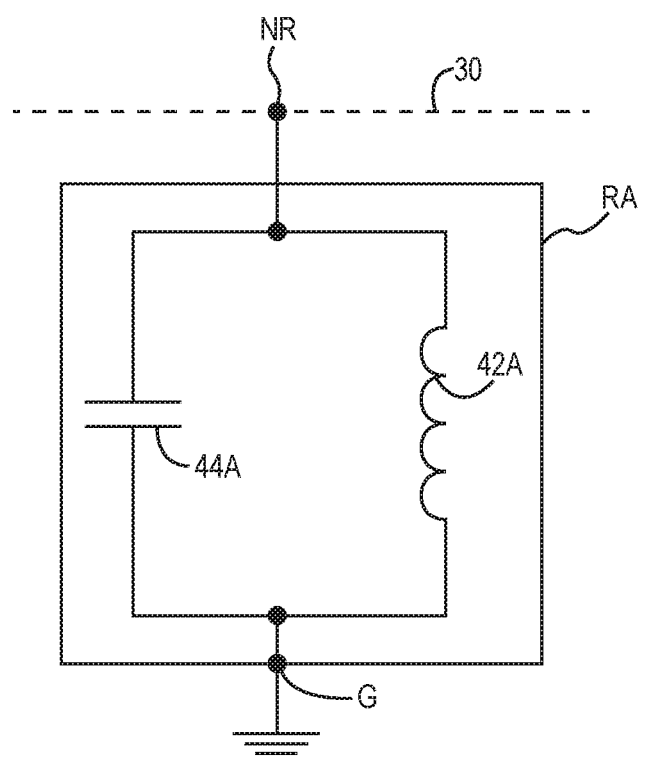
FIGS. 3A-3B show different types of resonators that may be provided in the class of RF filter paths shown in FIG. 2.
Figure 3B:
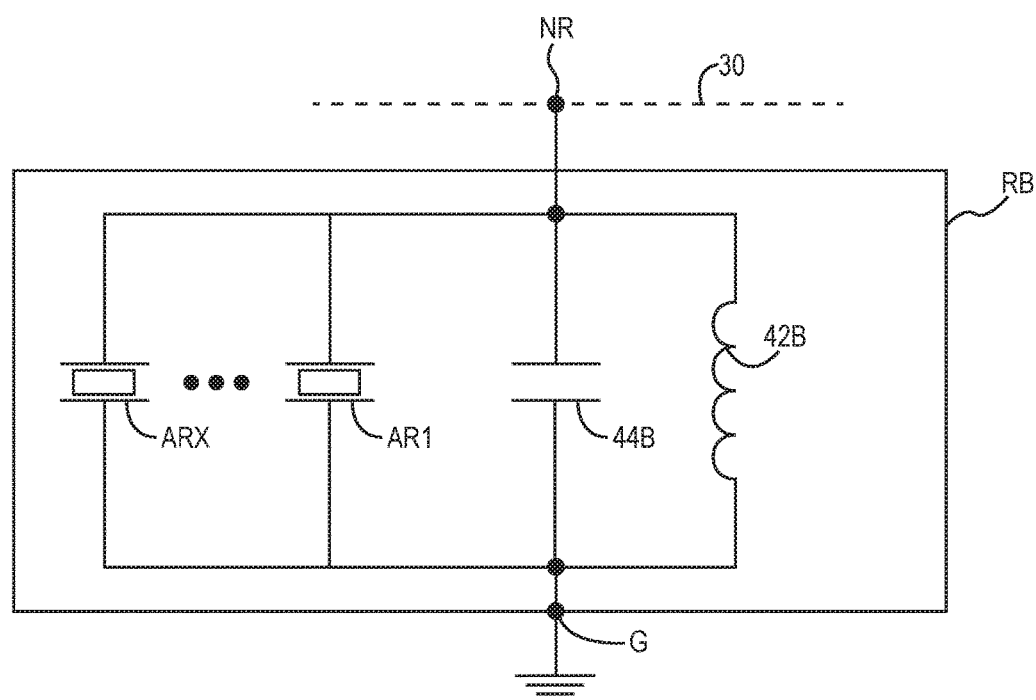

FIG. 3A and FIG. 3B illustrate different types of resonators (referred to generically or generally as resonators R). More specifically, FIG. 3A illustrates a resonator RA and FIG. 3B illustrates a resonator RB. Different embodiments of the RF filter path RFFP(I) shown in FIG. 2 may have the resonator 26 provided in accordance with the resonator RA shown in FIG. 3A and different embodiments of the RF filter path RFFP(I) may provide resonator 26 as the resonator RB shown in FIG. 3B. Also, different embodiments of the RF filter path RFFP(I) shown in FIG. 2 may have the resonator 28 provided in accordance with the resonator RA shown in FIG. 3A and different embodiments of the RF filter path RFFP(I) may provide resonator 28 as the resonator RB shown in FIG. 3B.

Referring now to FIG. 3A, FIG. 3A illustrates a resonator RA. The resonator RA is a parallel resonator. More specifically, the resonator RA includes an inductor 42A and a capacitive element 44A connected in parallel. The inductor 42A and the capacitive element 44A are both connected in shunt with respect to the main branch 30. In this embodiment, the inductor 42A shown in FIG. 3A is connected in shunt with respect to the main branch 30 of the RF filter path RFFP(I) between a node NR and a grounded node G. Furthermore, the capacitive element 44A shown in FIG. 3A is also connected in shunt with respect to the main branch 30 of the RF filter path RFFP(I) between the node NR and the grounded node G.

The node NR is either the node NR(26) when the resonator RA is provided as the resonator 26 shown in FIG. 2 or the node NR(28) when the resonator RA is provided as the resonator 28 shown in FIG. 2. The node G is either the node G(26) (shown in FIG. 2) when the resonator RA is provided as the resonator 26 shown in FIG. 2 or the node G(28) (shown in FIG. 2) when the resonator RA is provided as the resonator 28 shown in FIG. 2. The inductor 42A and the capacitive element 44A thereby form a parallel resonator. Note that in this embodiment, the resonator RA only includes the inductor 42A and the capacitive element 44A but does not include any other elements. Furthermore, the inductor 42A and the capacitive element 44A of the resonator RA are configured to resonate at a frequency within the passband of the transfer response. Alternative embodiments of the resonator RA may include additional inductors or capacitive elements.

FIG. 3B illustrates the resonator RB. The resonator RB is a parallel resonator. More specifically, the resonator RB includes an inductor 42B, a capacitive element 44B, and acoustic wave resonators (referred to generically or collectively as acoustic wave resonators AR and specifically as acoustic wave resonators AR1-ARX) connected in parallel. Thus, an integer number X indicates how many of the acoustic wave resonators AR are present so that an integer variable x from 1 to X identifies each of the acoustic wave resonators. The integer number X is greater than or equal to one. Thus, when X=1, only the acoustic wave resonator AR1 is provided. However, when X is greater than 1, more than one of the acoustic wave resonators AR1-ARM is provided. The inductor 42B, the capacitive element 44B, and the acoustic wave resonators AR are all connected in shunt with respect to the main branch 30.

In this embodiment, the inductor 42B shown in FIG. 3B is connected in shunt with respect to the main branch 30 of the RF filter path RFFP(I) between a node NR and a grounded node G. Furthermore, the capacitive element 44B shown in FIG. 3B is also connected in shunt with respect to the main branch 30 of the RF filter path RFFP(I) between the node NR and the grounded node G. Furthermore, for every value of the integer variable x from 1 to X, the acoustic wave resonator ARm is connected in shunt with respect to the main branch 30 between the node NR and the grounded node G. The node NR is either the node NR(26) when the resonator RB is provided as the resonator 26 shown in FIG. 2 or the node NR(28) when the resonator RB is provided as the resonator 28 shown in FIG. 2. The node G is either the node G(26) when the resonator RB is provided as the resonator 26 shown in FIG. 2 or the node G(28) when the resonator RB is provided as the resonator 28 shown in FIG. 2. The inductor 42B, the capacitive element 44B, and the acoustic wave resonators AR1-ARM thereby form a parallel resonator.

Note that in this embodiment, the resonator RB includes the inductor 42B, the capacitive element 44B, and one or more of the acoustic wave resonators AR. The inductor 42B and the capacitive element 44B of the resonator RB are configured to resonate at a frequency within the passband of the transfer response. Alternative embodiments of the resonator RB may include additional inductors or capacitive elements. The acoustic wave resonators AR help to increase a Q factor of the resonator RB by increasing roll-off from one edge of the passband.

Figure 4A:
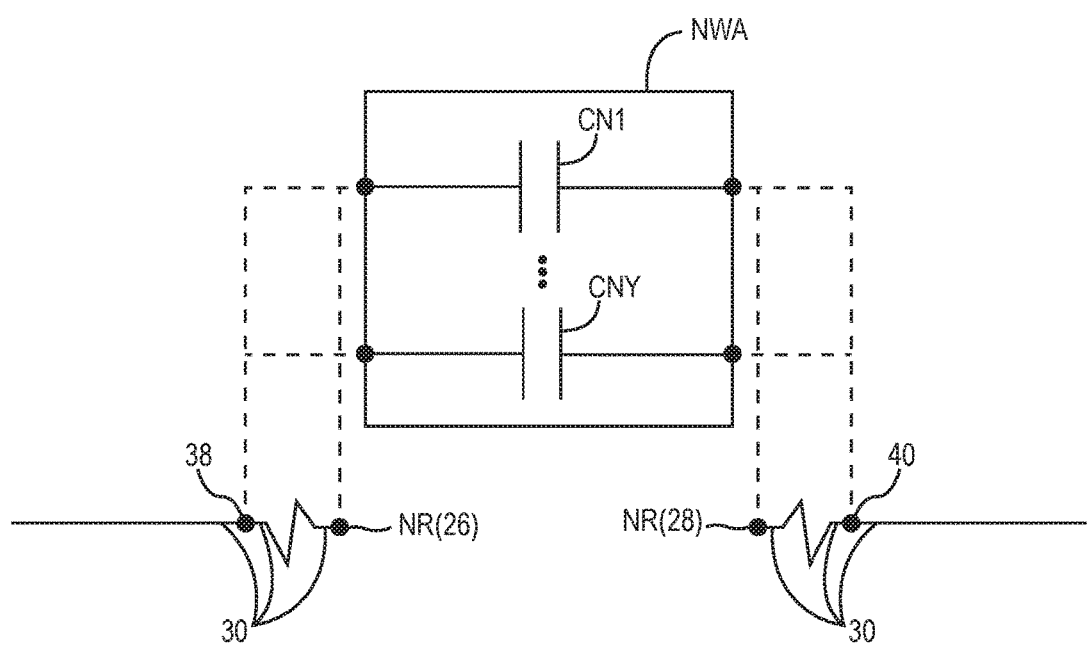
FIGS. 4A-4C show different types of notch networks that may be provided in the notch network shown in FIG. 2.
Figure 4B:
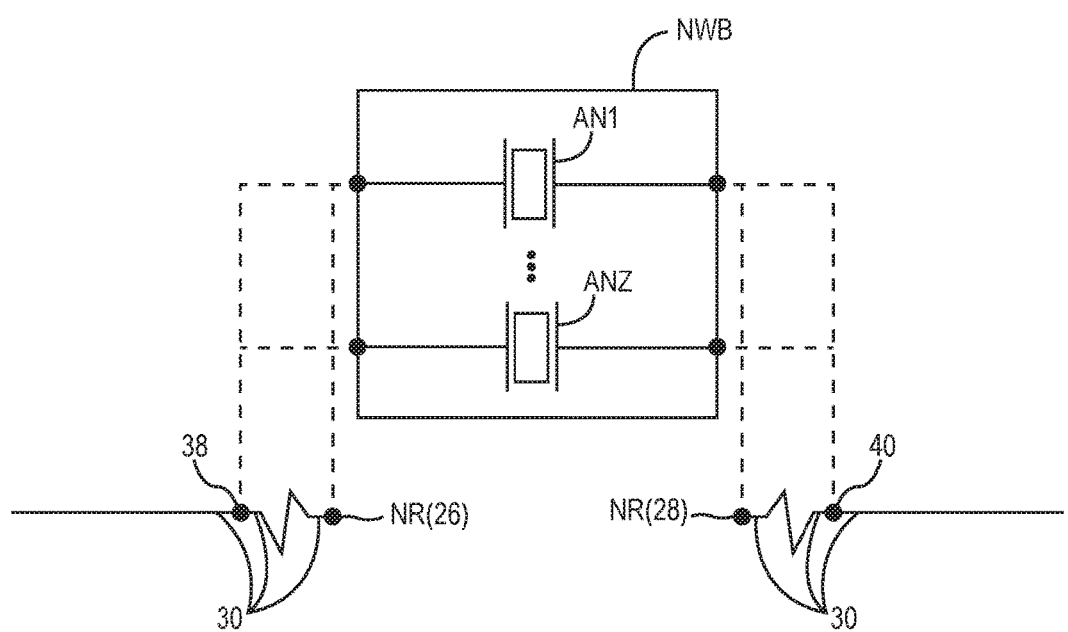
Figure 4C:
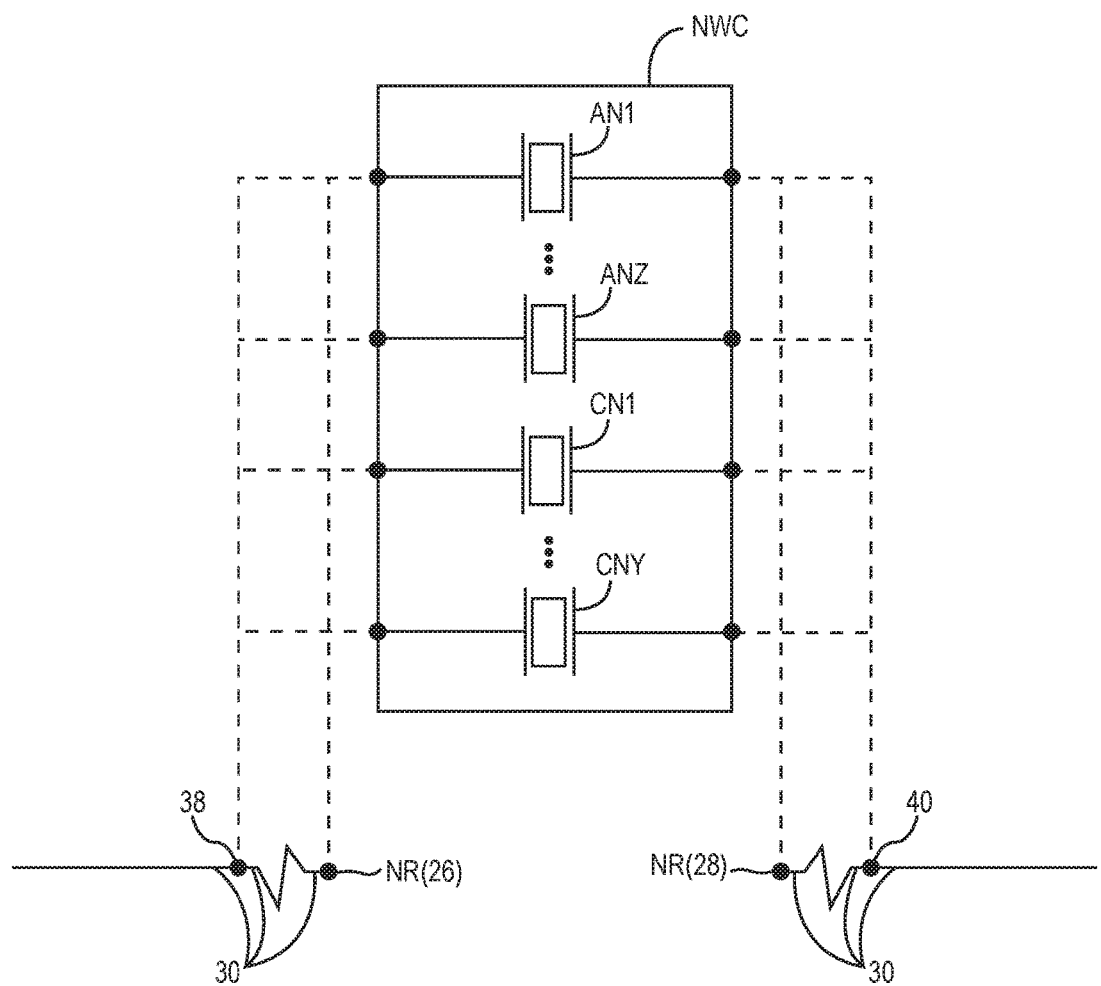

FIGS. 4A-4C illustrate different embodiments of notch networks (referred to generically or collectively as NW and specifically as notch networks NWA-NWC). More specifically, FIG. 4A illustrates a notch network NWA, FIG. 4B illustrates a notch network NWB, and FIG. 4C illustrates a notch network NWC. Different embodiments of the RF filter path RFFP(I) shown in FIG. 2 may have the notch network 36 provided in accordance with the notch network NWA shown in FIG. 4A, the notch network NWB shown in FIG. 4B, or the notch network 36 provided in accordance with the notch network NWC shown in FIG. 4C.

FIG. 4A illustrates the notch network NWA, which is one type of notch network that may be provided as the notch network 36 shown in FIG. 2. The notch network NWA is configured such that the transfer response between the port 22 and the port 24 defines the stopband adjacent to the passband without substantially increasing ripple variation of the passband defined by the transfer response. In the exemplary arrangements described by FIG. 4A, the notch network NWA is connected in parallel to portion(s) of the main branch 30 that includes the node NR(26) and the node NR(28), as explained in further detail below. Again, the node NR(26) is where the resonator 26 shown in FIG. 2 is connected in shunt to the main branch 30 and the node NR(28) is where the resonator 28 shown in FIG. 2 is connected to the main branch 30. The notch network NWA provides low loading within the passband while providing the stopband adjacent to the passband. As explained in further detail below, this can be done with the appropriate selection of components within the RF filter path RFFP(I) (shown in FIG. 2) and the notch network NWA. The stopband sharpens the passband of the RF filter path RFFP(I) (shown in FIG. 2) by increasing the roll-off and thereby increasing the selectivity of the RF filter path RFFP(I) (shown in FIG. 2).

The notch network NWA is a type of notch network that includes capacitive elements (referred to generically or collectively as capacitive elements CN and specifically as capacitive elements CN1-CNY). Each of the capacitive elements CN is coupled between the resonator 26 (shown in FIG. 2) and the resonator 28 (shown in FIG. 2). Thus, an integer number Y indicates how many of the capacitive elements CN are present so that an integer variable y from 1 to Y identifies each of the acoustic wave resonators. The integer number Y is greater or equal to one. Thus, when Y=1, only the capacitive element CN1 is provided. However, when Y is greater than 1, more than one of the capacitive elements CN1-CNY is provided. The capacitive elements CN are all connected in parallel to a portion of the main branch 30.

Each of the capacitive elements CN is coupled to the resonator 26 shown in FIG. 2 by either being connected to the main branch at node NR(26) or by being connected to the main branch at the connection node 38. Each of the capacitive elements CN is coupled to the resonator 28 shown in FIG. 2 by either being connected to the main branch 30 at node NR(28) or by being connected to the main branch 30 at the connection node 40. Thus, for every value of the integer variable y from 1 to Y, the capacitive element CNy is connected in series between either the connection node 38 or the node NR(26), and either the node NR(28) or the connection node 40. For example, when the capacitive element CNy is series connected between node NR(26) and connection node 40, the capacitive element CNy is connected in series within a subpath where the subpath is connected in parallel with a portion of the main branch 30 from node NR(26) to connection node 40. On the other hand, when the capacitive element CNy is series connected between connection node 38 and node NR(28), the capacitive element CNy is connected in series within a subpath, where the subpath is connected in parallel with a portion of the main branch 30 from connection node 38 to node NR(28). In either case, the capacitive element CNy is series connected in a subpath, where the subpath is coupled between the resonator 26 and the resonator 28.

FIG. 4B illustrates the notch network NWB. The notch network NWB is configured such that the transfer response between the port 22 and the port 24 defines the stopband adjacent to the passband without substantially increasing ripple variation of the passband defined by the transfer response. In the exemplary arrangements described by FIG. 4B, the notch network NWB is connected in parallel to portion(s) of the main branch 30 that includes the node NR(26) and the node NR(28), as explained in further detail below. Again, the node NR(26) is where the resonator 26 shown in FIG. 2 is connected in shunt to the main branch 30 and the node NR(28) is where the resonator 28 shown in FIG. 2 is connected to the main branch 30.

The notch network NWB provides low loading within the passband while providing the stopband adjacent to the passband. As explained in further detail below, this can be done with the appropriate selection of components within the RF filter path RFFP(I) (shown in FIG. 2) and the notch network NWB. The stopband sharpens the passband of the RF filter path RFFP(I) (shown in FIG. 2) by increasing the roll-off and thereby increasing the selectivity of the RF filter path RFFP(I) (shown in FIG. 2).

The notch network NWB is a type of notch network that includes acoustic wave resonators (referred to generically or collectively as acoustic wave resonators AN and specifically as acoustic wave resonators AN1-ANZ). Each of the acoustic wave resonators AN is coupled between the resonator 26 (shown in FIG. 2) and the resonator 28 (shown in FIG. 2). Thus, an integer number Z indicates how many of the acoustic wave resonators AN are present so that an integer variable z from 1 to Z identifies each of the acoustic wave resonators. The integer number Z is greater or equal to one. Thus, when Z=1, only the acoustic wave resonator AN1 is provided. However, when Z is greater than 1, more than one of the acoustic wave resonators AN1-ANZ is provided. The acoustic wave resonators AN are all connected in parallel to a portion of the main branch 30. Each of the acoustic wave resonators AN is coupled to the resonator 26 shown in FIG. 2 by either being connected to the main branch at node NR(26) or by being connected to the main branch at connection node 38. Each of the acoustic wave resonators AN is coupled to the resonator 28 shown in FIG. 2 by either being connected to the main branch 30 at node NR(28) or by being connected to the main branch 30 at connection node 40. Thus, for every value of the integer variable z from 1 to Z, the acoustic wave resonator ANz is connected in series between either the connection node 38 or the node NR(26), and either the node NR(28) or the connection node 40. For example, when the acoustic wave resonator ANz is series connected between node NR(26) and connection node 40, the acoustic wave resonator ANm is connected in series within a subpath, where the subpath is connected in parallel with a portion of the main branch 30 from node NR(26) to connection node 40. When the acoustic wave resonator ANm is series connected between connection node 38 and node NR(28), the acoustic wave resonator ANz is connected in series within a subpath, where the subpath is connected in parallel with a portion of the main branch 30 from connection node 38 to node NR(28). In either case, the acoustic wave resonator ANz is series connected in a subpath, where the subpath is coupled between the resonator 26 and the resonator 28.

FIG. 4C illustrates the notch network NWC. The notch network NWC is configured such that the transfer response between the port 22 and the port 24 defines the stopband adjacent to the passband without substantially increasing ripple variation of the passband defined by the transfer response. In the exemplary arrangements described by FIG. 4C, the notch network NWC is connected in parallel to portion(s) of the main branch 30 that includes the node NR(26) and the node NR(28), as explained in further detail below. Again, the node NR(26) is where the resonator 26 shown in FIG. 2 is connected in shunt to the main branch 30 and the node NR(28) is where the resonator 28 shown in FIG. 2 is connected to the main branch 30. The notch network NWC provides low loading within the passband while providing the stopband adjacent to the passband. As explained in further detail below, this can be done with the appropriate selection of components within the RF filter path RFFP(I) (shown in FIG. 2) and the notch network NWC. The stopband sharpens the passband of the RF filter path RFFP(I) (shown in FIG. 2) by increasing the roll-off and thereby increasing the selectivity of the RF filter path RFFP(I) (shown in FIG. 2).

Just like the notch network NWA shown in FIG. 4A, the notch network NWC shown in FIG. 4C includes capacitive elements, referred to generically or collectively as capacitive elements CN and specifically as capacitive elements CN1-CNY. Each of the capacitive elements CN is coupled between the resonator 26 (shown in FIG. 2) and the resonator 28 (shown in FIG. 2). Thus, an integer number Y indicates how many of the capacitive elements CN are present so that an integer variable y from 1 to Y identifies each of the acoustic wave resonators. The integer number Y is greater or equal to one. Thus, when Y=1, only the capacitive element CN1 is provided. However, when Y is greater than 1, more than one of the capacitive elements CN1-CNY is provided.

The capacitive elements CN are all connected in parallel to a portion of the main branch 30. Each of the capacitive elements CN is coupled to the resonator 26 shown in FIG. 2 by either being connected to the main branch at node NR(26) or by being connected to the main branch at connection node 38. Each of the capacitive elements CN is coupled to the resonator 28 shown in FIG. 2 by either being connected to the main branch 30 at node NR(28) or by being connected to the main branch 30 at connection node 40. Thus, for every value of the integer variable y from 1 to Y, the capacitive element CNy is connected in series between either the connection node 38 or the node NR(26), and either the node NR(28) or the connection node 40. For example, when the capacitive element CNy is series connected between node NR(26) and the connection node 40, the capacitive element CNy is connected in series within a subpath, where the subpath is connected in parallel with a portion of the main branch 30 from node NR(26) to connection node 40. On the other hand, when the capacitive element CNy is series connected between connection node 38 and node NR(28), the capacitive element CNy is connected in series within a subpath where the subpath is connected in parallel with a portion of the main branch 30 from connection node 38 to node NR(28). In either case, the capacitive element CNy is series connected in a subpath, where the subpath is coupled between the resonator 26 and the resonator 28. Thus, the notch network NWC can be considered to be a subtype as the notch network NWA.

Just like the notch network NWB shown in FIG. 4B, the notch network NWC shown in FIG. 4C includes acoustic wave resonators (referred to generically or collectively as acoustic wave resonators AN and specifically as acoustic wave resonators AN1-ANZ). Each of the acoustic wave resonators AN is coupled between the resonator 26 (shown in FIG. 2) and the resonator 28 (shown in FIG. 2). Thus, an integer number Z indicates how many of the acoustic wave resonators AN are present so that an integer variable z from 1 to Z identifies each of the acoustic wave resonators. The integer number Z is greater or equal to one. Thus, when Z=1, only the acoustic wave resonator AN1 is provided. However, when Z is greater than 1, more than one of the acoustic wave resonators AN1-ANZ is provided. The acoustic wave resonators AN are all connected in parallel to a portion of the main branch 30. Each of the acoustic wave resonators AN is coupled to the resonator 26 shown in FIG. 2 by either being connected to the main branch at node NR(26) or by being connected to the main branch at connection node 38. Each of the acoustic wave resonators AN is coupled to the resonator 28 shown in FIG. 2 by either being connected to the main branch 30 at node NR(28) or by being connected to the main branch 30 at connection node 40. Thus, for every value of the integer variable z from 1 to Z, the acoustic wave resonator ANz is connected in series between either the connection node 38 or the node NR(26), and either the node NR(28) or the connection node 40. For example, when the acoustic wave resonator ANz is series connected between node NR(26) and connection node 40, the acoustic wave resonator ANz is connected in series within a subpath, where the subpath is connected in parallel with a portion of the main branch 30 from node NR(26) to connection node 40. When the acoustic wave resonator ANz is series connected between connection node 38 and node NR(28), the acoustic wave resonator ANz is connected in series within a subpath, where the subpath is connected in parallel with a portion of the main branch 30 from connection node 38 to node NR(28). In either case, the acoustic wave resonator ANz is series connected in a subpath, where the subpath is coupled between the resonator 26 and the resonator 28. Thus, the notch network NWC can be considered to be of a subtype of the notch network NWB.

Figure 5:
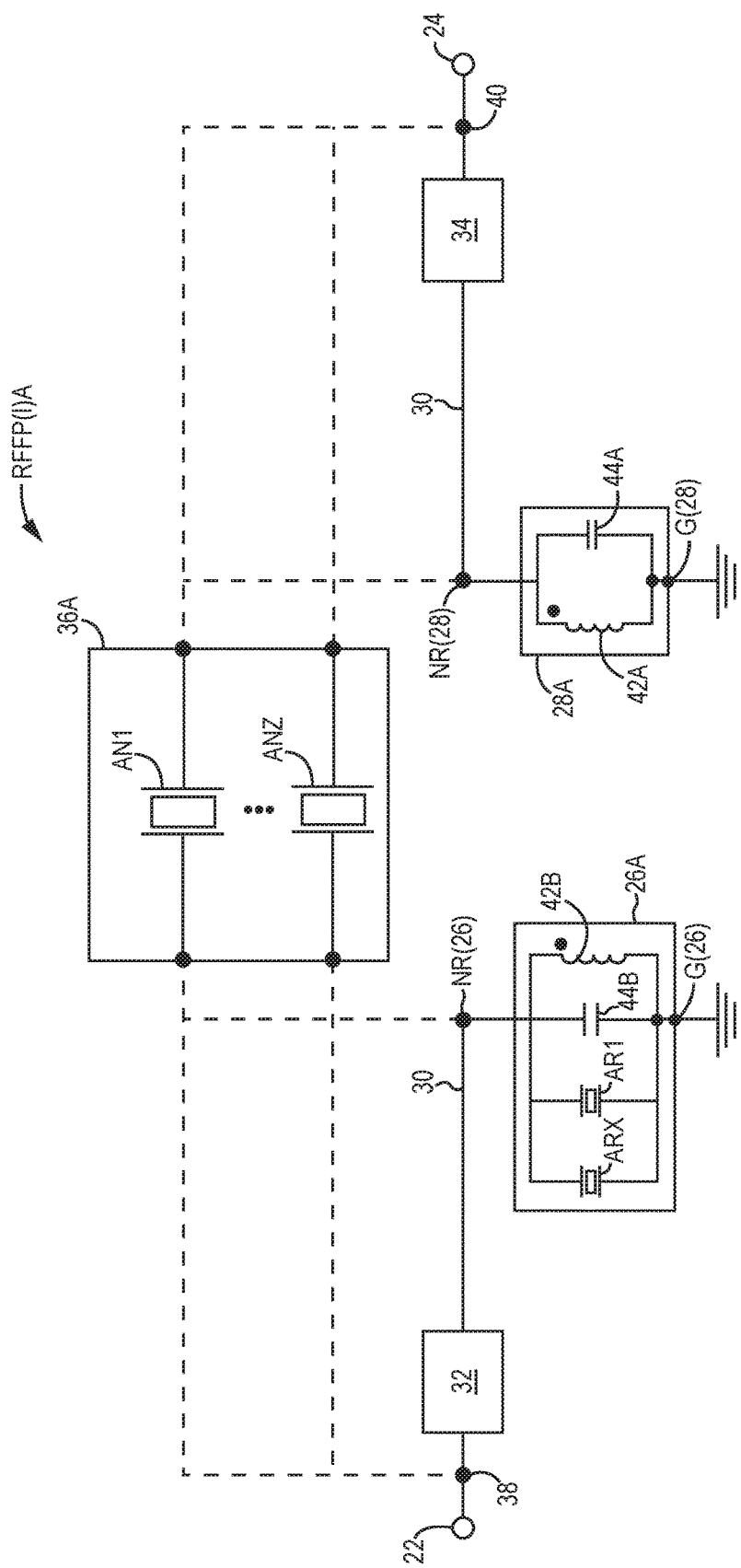
FIG. 5 illustrates a class of RF filter paths that is a subclass of the RF filter paths shown in FIG. 2, having at least one acoustic wave resonator and one parallel resonator, like in FIG. 3B, and at least one other acoustic wave resonator in the notch network, like in FIG. 4B or FIG. 4C.

FIG. 5 illustrates an exemplary RF filter path RFFP(I)A that describes a subclass of RF filter path RFFP(I) shown in FIG. 2 that is of particular relevance to this disclosure. Thus, the RF filter path RFFP(I)A is provided in the same manner as the RF filter path RFFP(I) shown in FIG. 2. The RF filter path RFFP(I)A is connected between the port 22 and the port 24. The RF filter path RFFP(I)A has at least one pair of resonators 26A, 28A that correspond to the pair of resonators 26, 28 described above in FIG. 2. The pair of resonators 26A, 28A are thus coupled to the main branch 30 in the same manner as that described above with respect to FIG. 2. Furthermore, the RF filter path RFFP(I)A includes a notch network 36A that corresponds with the notch network 36 described above with respect to FIG. 2. The RF filter path RFFP(I)A also includes the matching network 32 and the matching network 34 that are connected within the main branch 30 in the same manner described above with respect to FIG. 2. Thus, the RF filter path RFFP(I)A includes the nodes NR(26), NR(28), 38, 40 in the main branch 30 and includes connections to the nodes NR(26), NR(28), 38, 40 in same manner as the RF filter path RFFP(I) described above with respect to FIG. 2.

However, to be in the subclass described by the RF filter path RFFP(I)A, the resonator 26A is the type of resonator described by the resonator RB shown in FIG. 3B. Thus, the resonator 26A has the inductor 42B, the capacitive element 44B, and one or more of the acoustic wave resonators AR1-ARX described above in FIG. 3B, wherein the node NR in FIG. 3B is the node NR(26) shown in FIG. 5, and the node G shown in FIG. 3B is the node G(26) in FIG. 5.

Furthermore, to be in the subclass described by the RF filter path RFFP(I)A, the resonator 28A is the type of resonator described by the resonator RA shown in FIG. 3A. Thus, the resonator 28A only has the inductor 42A and the capacitive element 44A, wherein the node NR in FIG. 3A is the node NR(28) shown in FIG. 5, and the node G shown in FIG. 3A is the node G(28) in FIG. 5.

Furthermore, to be in the subclass described by the RF filter path RFFP(I)A, the notch network 36A includes one or more of the acoustic wave resonators AN1-ANZ and thus is the type of notch network described by the notch network NWB in FIG. 4B. Since the notch network NWC described in FIG. 4C is a subtype of the notch network NWB shown in FIG. 4B, some embodiments of the notch network 36A may be provided in accordance with the notch network NWC shown in FIG. 4C.

As shown in FIG. 5, the RF filter path RFFP(I)A has the main branch 30 that extends from the port 22 to the port 24. The RF filter path RFFP(I)A also includes sub-branches coming off the main branch 30. As explained in further detail below, the filtering components in the main branch 30 and in the sub-branches coming off the main branch 30 provide the desired response characteristics of the RF filter path RFFP(I)A. To provide the roll-off necessary to create the passband within the transfer response between the port 22 and the port 24, the RF filter path RFFP(I)A provides the resonator 26A and the resonator 28A both connected in shunt with respect to the RF filter path RFFP(I)A.

In this embodiment, the resonator 26A is connected between the node NR(26) in the main branch 30 and the grounded node G(26) connected to ground. Accordingly, the resonator 26A is connected in shunt to the main branch 30 at node NR(26). The node NR(26) is provided in the main branch 30. Also in this embodiment, the resonator 28A is connected between the node NR(28) in the main branch 30 and the grounded node G(28) connected to ground. Accordingly, the resonator 28A is connected in shunt to the main branch 30 at node NR(28). The resonators 26A, 28A in the RF filter path RFFP(I)A are configured such that a transfer response defines a passband. In this manner, RF signals that operate in frequency ranges within the passband propagate through the RF filter path RFFP(I)A between the port 22 and the port 24.

The RF filter path RFFP(I)A has a transfer response that is defined between the port 22 and the port 24. The resonators 26A, 28A in the RF filter path RFFP(I)A are configured such that the transfer response defines the passband. More specifically, the resonators 26A, 28A in the RF filter path RFFP(I)A are configured such that the transfer response defines the passband. As shown in FIG. 5, the RF filter path RFFP(I)A includes the matching network 32 that is connected within the main branch 30 between the port 22 and the node NR(28). The matching network 32 is configured to provide an impedance transformation that provides impedance matching at the port 22 as explained in further detail below. The resonator 26A is configured to resonate at a first frequency within the passband of the transfer response. In this manner, RF signals that operate in frequency ranges within the passband propagate through the RF filter path RFFP(I)A between the port 22 and the port 24.

The RF filter path RFFP(I)A also includes the matching network 34 that is connected within the main branch 30 between the node NR(28) and the port 24. The matching network 34 is configured to provide an impedance transformation that provides impedance matching at the port 24 as explained in further detail below. The resonator 28A is configured to resonate at a second frequency within the passband of the transfer response. In this manner, RF signals that operate in frequency ranges within the passband propagate through the RF filter path RFFP(I)A between the port 22 and the port 24.

As shown in FIG. 5, the RF filter path RFFP(I)A includes the notch network 36A coupled to the main branch 30 of the RF filter path RFFP(I)A. The notch network 36A is configured to define the stopband within the passband of the transfer response without substantially increasing ripple variation of the passband defined by the transfer response. Accordingly, although the notch network 36A is coupled to the RF filter path RFFP(I)A, the passband of the transfer response between the port 22 and the port 24 is not substantially affected by the notch network 36A. Thus, the notch network 36A is sufficiently isolated from the resonators 26A, 28A so that interaction between the notch network 36A and the resonators 26A, 28A does not increase variation within the passband. More specifically, loading of the RF filter path RFFP(I)A by the notch network 36A is so low that substantial rippling is not substantially created or substantially increased by the notch network 36A. Thus, insertion losses introduced by the notch network 36A between the port 22 and the port 24 are relatively small and constant within the passband of the transfer response. Nevertheless, by providing the stopband adjacent to the passband of the transfer response, the notch network 36A sharpens the passband by increasing roll-off of the passband to the stopband.

In FIG. 5, the notch network 36A is illustrated in two exemplary arrangements with respect to the RF filter path RFFP(I)A. In one exemplary arrangement, the notch network 36A is also connected between the port 22 and the port 24. More specifically, the notch network 36A is connected in parallel to the RF filter path RFFP(I)A with respect to the port 22 and the port 24. In this embodiment, the notch network 36A is coupled to the resonator 26A by being directly connected to the connection node 38 in the main branch 30 and/or by being directly connected to the node NR(26) in the main branch 30. The connection node 38 is provided in the main branch 30 between the port 22 and the matching network 32. Also, in this embodiment, the notch network 36A is coupled to the resonator 28A by being directly connected to the connection node 40 in the main branch 30 and/or by being directly connected to the node NR(28) in the main branch 30. The connection node 40 is provided in the main branch 30 between the matching network 34 and the port 24.

In the exemplary arrangement, the notch network 36A is also connected to the connection node 38 and to the connection node 40 so as to be in parallel with the RF filter path RFFP(I)A. Additionally, in this exemplary arrangement, the notch network 36A is configured to dissipate RF signals within the stopband of the transfer response and thereby prevent RF signals with the stopband from propagating between the port 22 and the port 24 or through the RF filter path RFFP(I)A. Dissipating the RF signals usually moderates the depth of the stopband and reduces flyback, thereby ensuring more isolation with respect to the passband and RF communication bands outside the stopband. The notch network 36A also increases roll-off necessary to create the passband within the transfer response between the port 22 and the port 24 so that the passband is isolated from the passband of other RF filter paths. To provide the roll-off necessary to create the passband within the transfer response between the port 22 and the port 24, the RF filter path RFFP(I)A provides the resonator 26A and the resonator 28A, both connected in shunt with respect to the RF filter path RFFP(I)A.

Figure 6:
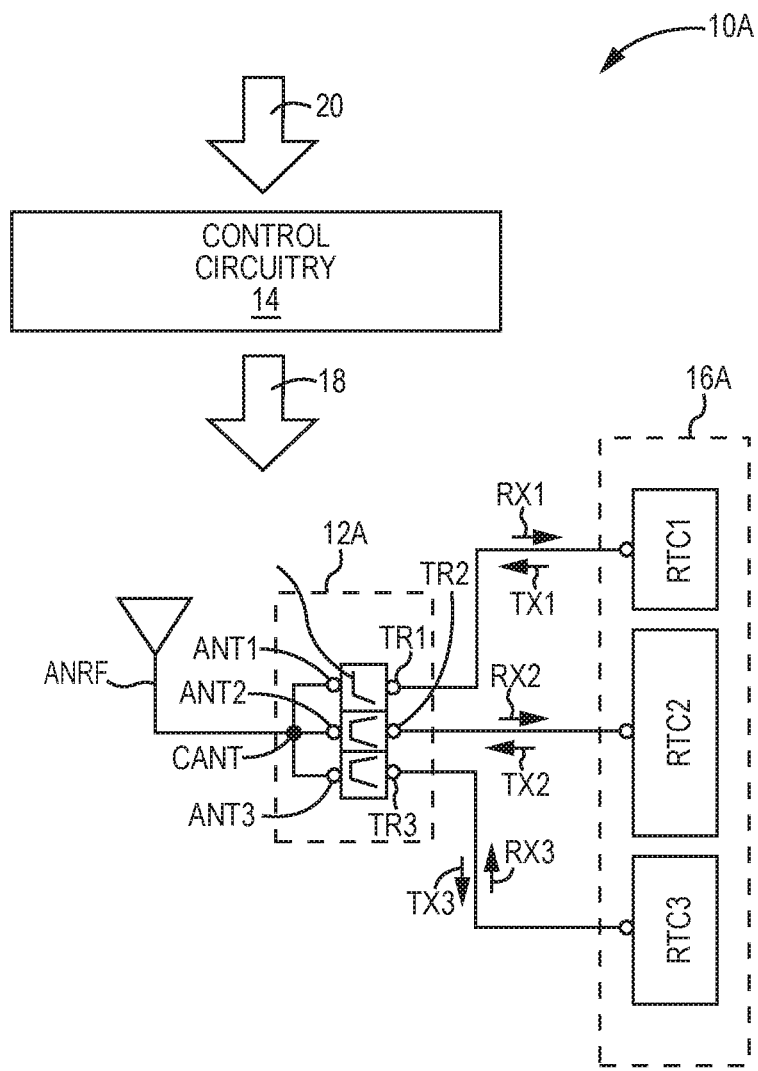
FIG. 6 illustrates an embodiment of the RF front end circuitry shown in FIG. 1 with an embodiment of the RF filter structure shown in FIG. 1 that provides triplexing.

FIG. 6 illustrates an embodiment of the RF front end circuitry 10A, which is one embodiment of the RF front end circuitry 10 shown in FIG. 1 where the integer value of M is equal to three. Thus, the RF front end circuitry 10A includes an RF filter structure 12A. The RF filter structure 12A shown in FIG. 6 is an embodiment of the RF filter structure 12 described above with respect to FIG. 1 and includes three RF filter paths RFFP1, RFFP2, and RFFP3 as described above with respect to the RF filter paths RFFP shown in FIG. 1, since M is equal to three. Thus, ports ANT1, ANT2, ANT3 and ports TR1, TR2, TR3 are included in the RF filter structure 12A shown in FIG. 6 and provided as described above with respect to the ports ANT and the ports TR described above with respect to FIG. 1.

The RF front end circuitry 10A also includes the control circuitry 14 described above with respect to FIG. 1. Finally, the RF front end circuitry 10A includes RF transceiver circuitry 16A. The RF transceiver circuitry 16A shown in FIG. 6 is an embodiment of the RF transceiver circuitry 16 described above with respect to FIG. 1, and includes three RF transceiver chains RTC1, RTC2, and RTC3 as described above with respect to the RF transceiver chains RTC shown in FIG. 1, since M is equal to three. Thus, ports TT1, TT2, TT3 are included in the RF transceiver circuitry 16A shown in FIG. 6 and provided as described above with respect to the ports ANT and the ports TR described above with respect to FIG. 1. Finally, RF receive signals RX1, RX2, RX3 and RF transmit signals TX1, TX2, TX3 are routed and processed by the RF front end circuitry 10A shown in FIG. 6 in the same manner as the RF receive signals RX and the RF transmit signals TX described above with respect to FIG. 1. Thus, the RF filter structure 12A shown in FIG. 6 is a class of the RF filter structure 12, referred to as a triplexer.

Figure 7:
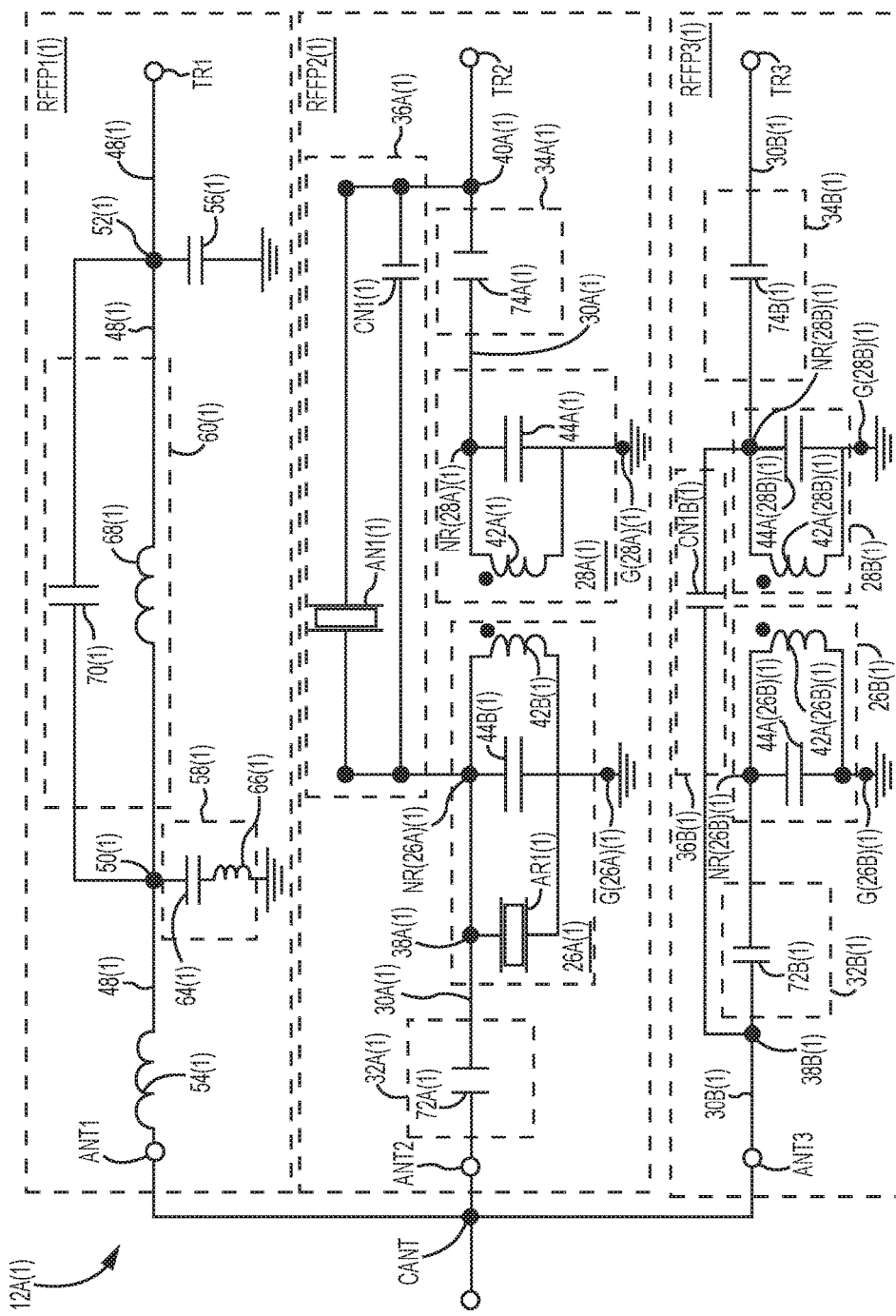
FIG. 7 illustrates one embodiment of the RF filter structure shown in FIG. 6, where one embodiment of an RF filter path is a member of the class described in FIG. 5.

FIG. 7 illustrates a circuit diagram of RF filter structure 12A(1), which is an embodiment of the RF filter structure 12A shown in FIG. 6 and thus is a member of the subclass of RF filter structures defined by the RF filter structure 12A shown in FIG. 6. In this embodiment, the RF filter structure 12A(1) includes an RF filter path RFFP1(1), an RF filter path RFFP2(1), and an RF filter path RFFP3(1). The RF filter path RFFP1(1) shown in FIG. 7 is a circuit diagram of one embodiment of the RF filter path RFFP1 shown in FIG. 6. The RF filter path RFFP2(1) shown in FIG. 7 is a circuit diagram of one embodiment of the RF filter path RFFP2 shown in FIG. 6. The RF filter path RFFP3(1) shown in FIG. 7 is a circuit diagram of one embodiment of the RF filter path RFFP3 shown in FIG. 6.

The RF filter path RFFP1(1) is connected between the port ANT1 and the port TR1. The RF filter path RFFP1(1) is thus configured to define a transfer response between the port ANT1 and the port TR1, wherein the transfer response of the RF filter path RFFP1(1) defines a passband that extends across a first frequency range. In this embodiment, the first frequency range is the lowest frequency range.

The RF filter path RFFP1(1) defines a main branch 48(1) that extends from the port ANT1 to the port TR1. The port ANT1 shown in FIG. 7 is connected to the common port CANT. A connection node 50(1) and a connection node 52(1) are defined within the main branch 48(1), as explained in further detail below. As shown in FIG. 7, the RF filter path RFFP1(1) includes an inductor 54(1), a series resonator 58(1), a parallel resonator 60(1), and a capacitive element 56(1). The inductor 54(1) is coupled in series within the main branch 48(1) between the port ANT1 and the connection node 50(1). The series resonator 58(1) is connected in shunt with respect to the main branch 48(1). More specifically, the series resonator 58(1) is directly connected to the main branch at the connection node 50(1) so that the series resonator 58(1) is connected in series between the connection node 50(1) and ground.

Thus, the series resonator 58(1) is provided within a shunt subpath, and the series resonator 58(1) is connected at the connection node 50(1) to the RF filter path RFFP1(1). In this embodiment, the series resonator 58(1) includes a capacitive element 64(1) and an inductor 66(1) coupled in series within the shunt subpath, which is connected to the main branch 48(1) at the connection node 50(1). In this manner, the capacitive element 64(1) and the inductor 66(1) form the series resonator 58(1). The series resonator 58(1) is configured to resonate at a first frequency within the first passband of the first transfer response defined between the port ANT1 and the port TR1.

The parallel resonator 60(1) shown in FIG. 7 includes an inductor 68(1) and a capacitive element 70(1) connected in parallel. In this embodiment, the inductor 68(1) is connected in series within the main branch 48(1) between the connection node 50(1) and the connection node 52(1). The capacitive element 70(1) is connected in parallel to the inductor 68(1) but is connected in series between the connection node 50(1) and the connection node 52(1) so as to form parallel resonator 60(1). The parallel resonator 60(1) is also configured to resonate at approximately the first frequency within the first passband of the first transfer response defined between the port ANT1 and the port TR1. Thus, the series resonator 58(1) and the parallel resonator 60(1) are each configured to resonate at substantially the same frequency. In this manner, the series resonator 58(1) and the parallel resonator 60(1) define the first passband in the first transfer response between the port ANT1 and the port TR1.

The parallel resonator 60(1) is connected in series within the main branch 48(1) between the connection node 50(1) and a connection node 52(1). The connection node 52(1) is provided in the main branch 48(1) between the parallel resonator 60(1) and the port TR1. In this embodiment, the connection node 52(1) is directly connected to the port TR1. The capacitive element 56(1) is connected in shunt within respect to the main branch 48(1) of the RF filter path RFFP1(1). More specifically, the capacitive element 56(1) is directly connected to connection node 52(1) so that the capacitive element 56(1) shunts the connection node 52(1) to ground.

FIG. 7 also illustrates a circuit diagram of an RF filter path RFFP2(1) that is one embodiment of the RF filter path RFFP2 shown in FIG. 6. The RF filter path RFFP2(1) is an instance of the type described by the RF filter path RFFP(I)A shown in FIG. 6, where for the RF filter path RFFP2(1), X=1, Y=1, and Z=1 such that the port ANT2 corresponds to the port 22 in FIG. 5 and such that the port TR2 corresponds to the port 24 shown in FIG. 5. Thus, the RF filter path RFFP2(1) shown in FIG. 7 includes a resonator 26A(1), a resonator 28A(1), a main branch 30A(1), a matching network 32A(1), a matching network 34A(1), a notch network 36A(1), a connection node 38A(1), a connection node 40A(1), a inductor 42B(1), a capacitive element 44B(1), a inductor 42A(1), a capacitive element 44A(1) a node NR(26A)(1), a ground node G(26A)(1), a node NR(28A)(1), a ground node G(28A)(1) that are embodiments of and correspond to the resonator 26A, the resonator 28A, the main branch 30, the matching network 32, the matching network 34, the notch network 36A, the connection node 38, the connection node 40, the inductor 42B, the capacitive element 44B, the inductor 42A, the capacitive element 44A the node NR(26), the ground node G(26), the node NR(28), the ground node G(28), respectively, of the RF filter path RFPP(I)A shown above with respect to FIG. 5. Since X=1, the RF filter path RFFP2(1) shown in FIG. 7 includes an acoustic wave resonator AR1(1), which corresponds with the acoustic wave resonator AR1 described above with respect to FIG. 5, but does not include any other acoustic wave resonators AR (described above with respect to FIG. 5). Since Y=1 and Z=1, the notch network 36A(1) includes a capacitive element CN1(1), which corresponds with the capacitive element CN1 described above with respect to FIG. 5, and an acoustic wave resonator AN1(1), which corresponds with the acoustic wave resonator AN1 described above with respect to FIG. 5. Thus, the notch network 36A(1) is a member of the subclass of notch networks described by the notch network NWC described above with respect to FIG. 4C.

In FIG. 7, the capacitive element CN1(1) is connected in series between the node NR(26A)(1) and the connection node 40A(1). The capacitive element CN1(1) is connected in parallel with respect to the acoustic wave resonator AN1(1) and is connected in parallel to a portion of the main branch 30A(1) that is between the node NR26(1) and the connection node 40(1). However, the notch network 36A(1) does not include any other of the capacitive elements CN (described above with respect to FIG. 5) since Y=1. Also, in FIG. 7, the acoustic wave resonator AN1(1) is connected in series between the node NR(26A)(1) and the connection node 40A(1). The acoustic wave resonator AN1(1) is connected in parallel with respect to the capacitive element CN1(1) and is connected in parallel to the portion of the main branch 30A(1) that is between the node NR26(1) and the connection node 40(1). However, the notch network 36A(1) does not include any other of the capacitive elements AN.

Furthermore, since the notch network 36A(1) shown in FIG. 7 includes at least one of the acoustic wave resonators AN and at least one of the capacitive elements CN shown in FIG. 5, the notch network 36A(1) is the same type of notch network as the notch network NWC described above with respect to FIG. 4C.

The matching network 32A(1) as illustrated in FIG. 7 is an embodiment of the matching network 32 described above with respect to FIG. 2 and with respect to FIG. 5. Thus, in this embodiment, the matching network 32A(1) shown in FIG. 7 is connected within the main branch 30A(1) between the port ANT2 (which corresponds to the port 22 shown in FIG. 2 and in FIG. 5) and the node NR(26A)(1) (which corresponds to the node NR(26) in FIG. 2 and in FIG. 5). The matching network 32A(1) shown in FIG. 7 is configured to substantially match a source impedance seen by the RF filter path RFFP2(1) as seen at the port ANT2 to a path impedance at the node NR(26A)(1). The matching network 32A(1) shown in FIG. 7 only includes a capacitive element 72A(1). The capacitive element 72A(1) is connected in series within the main branch 30A(1) between the port ANT2 and the node NR(26A)(1).

The matching network 34A(1) as illustrated in FIG. 7 is an embodiment of the matching network 34 described above with respect to FIG. 2 and with respect to FIG. 5. Thus, in this embodiment, the matching network 34A(1) shown in FIG. 7 is connected within the main branch 30A(1) between the node NR(28A)(1) (which corresponds to the node NR(28) in FIG. 2 and in FIG. 5) and the port TR2 (which corresponds to the port 24 shown in FIG. 2 and in FIG. 5). The matching network 34A(1) shown in FIG. 7 is configured to substantially match a path impedance seen at the node NR(28A)(1) to a load impedance seen by the RF filter path RFFP2(1) as seen at the port TR2. The matching network 34A(1) shown in FIG. 7 only includes a capacitive element 74A(1). The capacitive element 74A(1) is connected in series within the main branch 30A(1) between the node NR(28A)(1) and the port TR2.

FIG. 7 also illustrates a circuit diagram of an RF filter path RFFP3(1) that is one embodiment of the RF filter path RFFP3 shown in FIG. 6. The RF filter path RFFP3(1) is a member of the class of RF filters described by the RF filter path RFFP(I) shown in FIG. 2 but is not a member of the subclass of RF filter paths described by the RF filter path RFFP(I)A shown in FIG. 6. The RF filter path RFFP3(1) shown in FIG. 7 is thus connected to extend between the port ANT3 (which corresponds to the port 22 shown in FIG. 2) and the port TR3 (which corresponds with the port 24 shown in FIG. 2). The RF filter path RFFP3(1) has at least pair of resonators 26B(1), 28B(1) that correspond to the pair of resonators 26, 28 described above in FIG. 2. The pair of resonators 26B(1), 28B(1) are thus coupled to the main branch 30 in the same manner as that described above with respect to FIG. 2. Furthermore, the RF filter path RFFP3(1) includes a notch network 36B(1) that corresponds with the notch network 36 described above with respect to FIG. 2. The RF filter path RFFP3(1) also includes a matching network 32B(1) and a matching network 34B(1) that are connected within the main branch 30B(1) in the same manner described above with respect to the matching networks 32, 34 shown in FIG. 2. Thus, the RF filter path RFFP3(1) includes the nodes NR(26B)(1), NR(28B)(1), 38B(1), 40B(1) in the main branch 30B(1) and includes connections to the nodes NR(26B)(1), NR(28B)(1), 38B(1), 40B(1) in the same manner as the RF filter path RFFP(I) described above with respect to FIG. 2.

The resonator 26B(1) is the type of resonator described by the resonator RA shown in FIG. 3A. Thus, the resonator 26B(1) only has an inductor 42A(266)(1) (that corresponds to the inductor 42A in FIG. 3A) and a capacitive element 44A(266)(1) (that corresponds to the capacitive element 44A in FIG. 3A), wherein the node NR in FIG. 3A is the node NR(26B)(1) of the RF filter path RFFP3(1) shown in FIG. 7, and the node G shown in FIG. 3A is the node G(26B)(1) of the RF filter path RFFP3(1) in FIG. 7.

Furthermore, to be in the subclass described by the RF filter path RFFP3(1), the resonator 28B(1) is the type of resonator described by the resonator RA shown in FIG. 3A. Thus, the resonator 28B(1) only has an inductor 42A(286)(1) (that corresponds to the inductor 42A in FIG. 3A) and a capacitive element 44A(286)(1) (that corresponds to the capacitive element 44A in FIG. 3A), wherein the node NR in FIG. 3A is the node NR(28B)(1) of the RF filter path RFFP3(1) shown in FIG. 7 and the node G shown in FIG. 3A is the node G(28B)(1) of the RF filter path RFFP3(1) in FIG. 7.

As shown in FIG. 7, the RF filter path RFFP3(1) has the main branch 30B(1) that extends from the port ANT3 to the port TR3. The RF filter path RFFP3(1) also includes sub-branches coming off the main branch 30B(1). As explained in further detail below, the filtering components in the main branch 30B(1) and in the sub-branches coming off the main branch provide the desired response characteristics of the RF filter path RFFP3(1). To provide the roll-off necessary to create the passband within the transfer response between the port ANT3 and the port TR3, the RF filter path RFFP3(1) provides the resonator 26B(1) and the resonator 28B(1) both connected in shunt with respect to the RF filter path RFFP3(1). In this embodiment, the resonator 26B(1) is connected between the node NR(26B)(1) in the main branch 30B(1) and the grounded node G(26B)(1) connected to ground. Accordingly, the resonator 26B(1) is connected in shunt to the main branch 30B(1) at node NR(26B)(1). The node NR(26B)(1) is provided in the main branch 30B(1). Also, in this embodiment, the resonator 28B(1) is connected between the node NR(28B)(1) in the main branch 30B(1) and the grounded node G(28B)(1) connected to ground. Accordingly, the resonator 28B(1) is connected in shunt to the main branch 30B(1) at node NR(28B)(1). The resonators 26B(1), 28B(1) in the RF filter path RFFP3(1) are configured such that a transfer response defines a passband. In this manner, RF signals that operate in frequency ranges within the passband propagate through the RF filter path RFFP3(1) between the port ANT3 and the port TR3.

The RF filter path RFFP3(1) has a transfer response that is defined between the port ANT3 and the port TR3. The resonators 26B(1), 28B(1) in the RF filter path RFFP3(1) are configured such that the transfer response defines the passband. More specifically, the resonators 26B(1), 28B(1) in the RF filter path RFFP3(1) are configured such that the transfer response defines the passband. As shown in FIG. 7, the RF filter path RFFP3(1) includes the matching network 32B(1) that is connected within the main branch 30B(1) between the port ANT3 and the node NR(28B)(1). The matching network 32B(1) is configured to provide an impedance transformation that provides impedance matching at the port ANT3 as explained in further detail below. The resonator 26B(1) is configured to resonate at a first frequency within the passband of the transfer response. In this manner, RF signals that operate in frequency ranges within the passband propagate through the RF filter path RFFP3(1) between the port ANT3 and the port TR3.

The RF filter path RFFP3(1) also includes the matching network 34B(1) that is connected within the main branch 30B(1) between the node NR(28B)(1) and the port TR3. The matching network 34B(1) is configured to provide an impedance transformation that provides impedance matching at the port TR3 as explained in further detail below. The resonator 28B(1) is configured to resonate at a second frequency within the passband of the transfer response. In this manner, RF signals that operate in frequency ranges within the passband propagate through the RF filter path RFFP3(1) between the port ANT3 and the port TR3.

As shown in FIG. 7, the RF filter path RFFP3(1) includes the notch network 36B(1) coupled to the main branch 30B(1) of the RF filter path RFFP3(1). The notch network 36B(1) is configured to define the stopband within the passband of the transfer response without substantially increasing ripple variation of the passband defined by the transfer response. Accordingly, although the notch network 36B(1) is coupled to the RF filter path RFFP3(1), the passband of the transfer response between the port ANT3 and the port TR3 is not substantially affected by the notch network 36B(1). Thus, the notch network 36B(1) is sufficiently isolated from the resonators 26B(1), 28B(1) so that interaction between the notch network 36B(1) and the resonators 26B(1), 28B(1) does not increase variation within the passband. More specifically, loading of the RF filter path RFFP3(1) by the notch network 36B(1) is so low that substantial rippling is not substantially created or substantially increased by the notch network 36B(1). Thus, insertion losses introduced by the notch network 36B(1) between the port ANT3 and the port TR3 are relatively small and constant within the passband of the transfer response. Nevertheless, by providing the stopband adjacent to the passband of the transfer response, the notch network 36B(1) sharpens the passband by increasing roll-off of the passband to the stopband.

In FIG. 7, the notch network 36B(1) shown in FIG. 1 is of the type described above by the notch network NWA shown in FIG. 4A, where Y=1. In this specific embodiment, the notch network 36B(1) includes a capacitive element CN1B(1) that corresponds to the capacitive element CN1 shown in FIG. 4A. In this embodiment, the capacitive element CN1B(1) is series connected between the connection node 38B(1) and the node NR(28B)(1), and the capacitive element CN1(B)(1) is connected in parallel with respect to a portion of the main branch 30B(1) between the connection node 38B(1) and the node NR(28B)(1).

In this exemplary arrangement, the notch network 36B(1) is configured to dissipate RF signals within the stopband of the transfer response and thereby prevent RF signals with the stopband from propagating between the port ANT3 and the port TR3 or through the RF filter path RFFP3(1). Dissipating the RF signals usually moderates the depth of the stopband and reduces flyback, thereby ensuring more isolation with respect to the passband and RF communication bands outside the stopband. The notch network 36B(1) also increases roll-off necessary to create the passband within the transfer response between the port ANT3 and the port TR3 so that the passband is isolated from the passband of other RF filter paths. To provide the roll-off necessary to create the passband within the transfer response between the port ANT3 and the port TR3, the RF filter path RFFP3(1) provides the resonator 26B(1) and the resonator 28B(1), both connected in shunt with respect to the RF filter path RFFP3(1).

In this embodiment, a matching network 32B(1) in FIG. 7 is an embodiment of the matching network 32 described above with respect to FIG. 2. Thus, in this embodiment, the matching network 32B(1) shown in FIG. 7 is connected within the main branch 30B(1) between the port ANT3 (which corresponds to the port 22 shown in FIG. 2) and the node NR(26B)(1) (which corresponds to the node NR(26) in FIG. 2). The matching network 32B(1) shown in FIG. 7 is configured to substantially match a source impedance seen by the RF filter path RFFP3B(1) as seen at the port ANT3 to a path impedance at the node NR(26B)(1). The matching network 32B(1) shown in FIG. 7 only includes a capacitive element 72B(1). The capacitive element 72B(1) is connected in series within the main branch 30B(1) between the port ANT3 and the node NR(26B)(1).

A matching network 34B(1) in FIG. 7 is an embodiment of the matching network 34 described above with respect to FIG. 2. Thus, in this embodiment, the matching network 34B(1) shown in FIG. 7 is connected within the main branch 30B(1) between the node NR(28B)(1) (which corresponds to the node NR(28) in FIG. 2) and the port TR3 (which corresponds to the port 24 shown in FIG. 2). The matching network 34B(1) shown in FIG. 7 is configured to substantially match a path impedance seen at the node NR(28B)(1) to a load impedance seen by the RF filter path RFFP3B(1) as seen at the port TR3. The matching network 34B(1) shown in FIG. 7 only includes a capacitive element 74B(1). The capacitive element 74B(1) is connected in series within the main branch 30B(1) between the node NR(28B)(1) and the port TR3.

Figure 8:
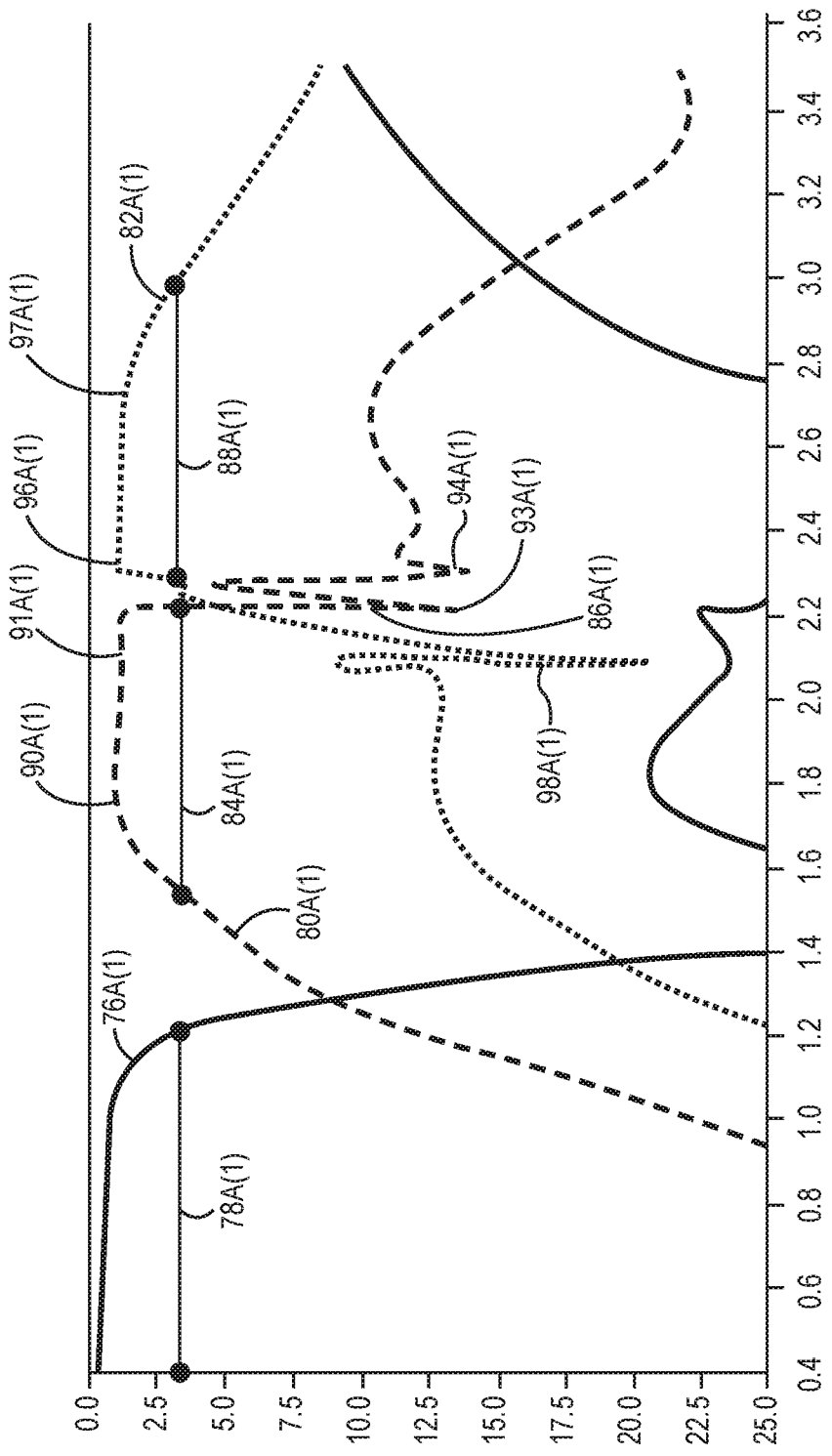
FIG. 8 illustrates the transfer responses of the RF filter structure shown in FIG. 7.

FIG. 8 illustrates an example of the first transfer function 76A(1) provided by the RF filter path RFFP1 between the port ANT1 and the port TR1. The RF filter path RFFP1(1) shown in FIG. 7 is configured to provide a first passband 78A(1) in the first filter response of the RF filter structure 12A(1) between the port ANT1 and the port TR1. As shown in FIG. 8, the RF filter path RFFP1(1) has been tuned to operate as a low pass filter so that the first passband 78A(1) passes all frequencies between at least 0.4 GHz to 1.5 GHz. Since the RF filter path RFFP1(1) provides low pass filtering, the first passband 78A(1) of the first transfer function 76A(1) may not have a low edge frequency provided 3 dB below the maximum or average maximum of the first transfer function 76A(1) within the first passband 78A(1). Instead, the first passband 78A(1) simply continues to the frequency of 0 GHz, which thereby provides the low edge frequency of the first passband 78A(1). The first passband 78A(1), however, does have a 3 dB point below the maxima or the average maxima of the first passband 78A(1), which in this case is provided at around 1.25 GHz. Therefore, the center frequency of the first passband 78A(1) is provided at approximately 0.625 GHz.

FIG. 8 also shows an embodiment of a second transfer response 80A(1) of the RF filter path RFFP2(1) between the port ANT2 and the port TR2. Furthermore, FIG. 8 also shows an embodiment of a third transfer response 82A(1) of the RF filter path RFFP3(1) between the port ANT3 and the port TR3. The second transfer response 80A(1) of the RF filter path RFFP2(1) defines a passband 84A(1) and a stopband 86A(1) between the port ANT2 and the port TR2. Furthermore, the third transfer response 82A(1) of the RF filter path RFFP3(1) defines a passband 88A(1) and a stopband 98A(1) between the port ANT3 and the port TR3.

With respect to the RF filter path RFFP1(1) that provides the first passband 78A(1) in the first transfer response 76A(1) shown in FIG. 8, the RF filter path RFFP1(1) can be provided as a low pass filter where the first passband is defined from a frequency of zero to a high edge frequency defined by a three dB point, as mentioned above. To provide adequate roll-off for the first passband and to prevent insertion losses from the RF filter path RFFP1(1), the parallel resonator 60(1) and the series resonator 58(1) are each tuned so that the transfer response 76A(1) remains below 20 dB from 1.3 GHz through 2.9 GHz and thereby provides adequate isolation.

With regards to the second transfer response 80A(1) between the port ANT2 and the port TR2 provided by the RF filter path RFFP2(2) of the RF filtering circuitry 12A(1) shown in FIG. 7, the second transfer response 80A(1) defines an embodiment of the second passband 84A(1) and the stopband 86A(1). The second passband 84A(1) of the second transfer response 80A(1) has a center frequency of approximately 1.8 GHz along with a local maxima 90A(1), and a local maxima 91A(1). The local maxima 90A(1) is provided by the parallel resonator 28A(1) of the RF filter path RFFP2(1), wherein the parallel resonator 28A(1) is configured to resonate at the frequency of approximately 1.7 GHz where the frequency provides correspondence to the location of the local maxima 90A(1), which is within the second passband 84A(1) but greater than the center frequency of 1.8 GHz. The second transfer response 80A(1) also includes the other local maxima 91A(1) at the frequency of 2.1 GHz, which is below the center frequency 1.8 GHz. The local maxima 91A(1) is created by the parallel resonator 26A(1), which is configured to resonate at the frequency of approximately 2.1 GHz within the second passband 84A(1).

The stopband 86A(1) of the second transfer response 80A(1) is located adjacent to the second passband 84A(1) of the second transfer response 80A(1) and includes a notch 93A(1) and a stopband 94A(1). The notch 93A(1) is created by the acoustic wave resonator AR1(1) in the parallel resonator 26(1) of the RF filter path RFFP2(1), while the stopband 94A(1) is created by the acoustic wave resonator AN1(1) in the notch network 36A(1) of the RF filter path RFFP2(1). In this embodiment, the stopband 86A(1) is provided by the three dB points that are higher than the average of the local minima at the center frequency of approximately 2.25 GHz.

As mentioned above, the third transfer response 82A(1) of the RF filter path RFFP3(1) defines the passband 88A(1) and the stopband 98A(1) between the port ANT3 and the port TR3. The third passband 88A(1) of the third transfer response 82A(1) has a center frequency of approximately 2.45 GHz along with a local maxima 96A(1), and a local maxima 97A(1). The local maxima 96A(1) is provided by the parallel resonator 26B(1) of the RF filter path RFFP3(1), wherein the parallel resonator 26B(1) is configured to resonate at the frequency of approximately 2.32 GHz where the frequency provides correspondence to the location of the local maxima 96A(1), which is within the second passband 84A(1) but greater than the center frequency of 2.25 GHz. The local maxima 97A(1) is provided by the parallel resonator 28B(1) of the RF filter path RFFP3(1), wherein the parallel resonator 26B(1) is configured to resonate at the frequency of approximately 2.8 GHz where the frequency provides correspondence to the location of the local maxima 97A(1).

The stopband 98A(1) of the third transfer response 82A(1) is located adjacent to the third passband 88A(1) of the third transfer response 82A(1) and is a notch 98A(1). The notch 93A(1) is created by the capacitor CN1(B)(1). In this embodiment, the stopband 98A(1) is provided by the three dB points that are higher than the local minima provided by the weak coupling at 2.05 GHz. Also, the inductor 42B(1) is weakly coupled to the inductor 42A(266)(1) and the inductor 42A(1) is weakly coupled to the inductor 42A(286)(1). This maintains the third transfer response 82A(1) below 12.5 dB for most of the remainder of the span of the second passband 84A(1) of the second transfer response 80A(1).

Figure 9:
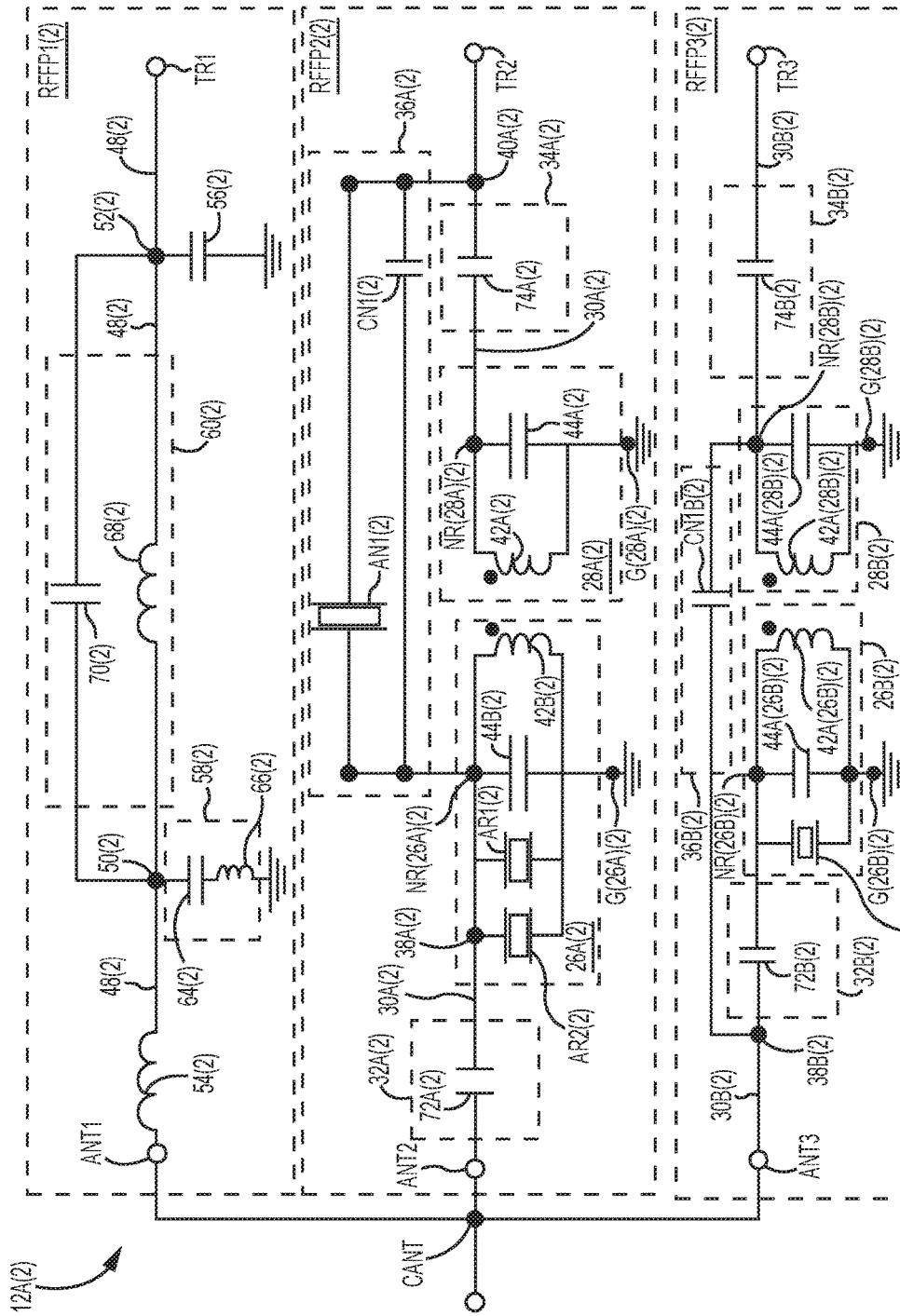
FIG. 9 illustrates another embodiment of the RF filter structure shown in FIG. 6, where one embodiment of an RF filter path is a member of the class described in FIG. 5 and another RF filter path is a member of the class described in FIG. 2 but is not in the subclass described in FIG. 5.

FIG. 9 illustrates a circuit diagram of RF filter structure 12A(2), which is an embodiment of the RF filter structure 12A shown in FIG. 6 and thus is a member of the subclass of RF filter structures defined by the RF filter structure 12A shown in FIG. 6. In this embodiment, the RF filter structure 12A(2) includes an RF filter path RFFP1(2), an RF filter path RFFP2(2), and an RF filter path RFFP3(2). The RF filter path RFFP1(2) shown in FIG. 9 is a circuit diagram of one embodiment of the RF filter path RFFP1 shown in FIG. 6. The RF filter path RFFP2(2) shown in FIG. 9 is a circuit diagram of one embodiment of the RF filter path RFFP2 shown in FIG. 6. The RF filter path RFFP3(2) shown in FIG. 9 is a circuit diagram of one embodiment of the RF filter path RFFP3 shown in FIG. 6.

The RF filter path RFFP1(2) is connected between the port ANT1 and the port TR1. The RF filter path RFFP1(2) is thus configured to define a transfer response between the port ANT1 and the port TR1, wherein the transfer response of the RF filter path RFFP1(2) defines a passband that extends across a first frequency range. In this embodiment, the first frequency range is the lowest frequency range.

With regard to the RF filter path RFFP1(2) shown in FIG. 9, the RF filter path RFFP1(2) defines a main branch 48(2) that extends from the port ANT1 to the port TR1. The port ANT1 shown in FIG. 9 is connected to the common port CANT. A connection node 50(2) and a connection node 52(2) are defined within the main branch 48(2), as explained in further detail below. As shown in FIG. 9, the RF filter path RFFP1(2) includes an inductor 54(2), a series resonator 58(2), a parallel resonator 60(2), and a capacitive element 56(2). The inductor 54(2) is coupled in series within the main branch 48(2) between the port ANT1 and the connection node 50(2). The series resonator 58(2) is connected in shunt with respect to the main branch 48(2). More specifically, the series resonator 58(2) is directly connected to the main branch 48(2) at the connection node 50(2) so that the series resonator 58(2) is connected in series between the connection node 50(2) and ground.

Thus the series resonator 58(2) is provided within a shunt subpath, and the series resonator 58(2) is connected at the connection node 50(2) to the RF filter path RFFP1(2). In this embodiment, the series resonator 58(2) includes a capacitive element 64(2) and an inductor 66(2) coupled in series within the shunt subpath, which is connected to the main branch 48(2) at the connection node 50(2). In this manner, the capacitive element 64(2) and the inductor 66(2) form the series resonator 58(2). The series resonator 58(2) is configured to resonate at a first frequency within the first passband of the first transfer response defined between the port ANT1 and the port TR1.

The parallel resonator 60(2) shown in FIG. 9 includes an inductor 68(2) and a capacitive element 70(2) connected in parallel. In this embodiment, the inductor 68(2) is connected in series within the main branch 48(2) between the connection node 50(2) and the connection node 52(2). The capacitive element 70(2) is connected in parallel to the inductor 68(2) but is connected in series between the connection node 50(2) and the connection node 52(2) so as to form parallel resonator 60(2). The parallel resonator 60(2) is also configured to resonate at approximately the first frequency within the first passband of the first transfer response defined between the port ANT1 and the port TR1. Thus, the series resonator 58(2) and the parallel resonator 60(2) are each configured to resonate at substantially the same frequency. In this manner, the series resonator 58(2) and the parallel resonator 60(2) define the first passband in the first transfer response between the port ANT1 and the port TR1.

With respect to the parallel resonator 60(2) shown in FIG. 9, the parallel resonator 60(2) is connected in series within the main branch 48(2) between the connection node 50(2) and a connection node 52(2). The connection node 52(2) is provided in the main branch 48(2) between the parallel resonator 60(2) and the port TR1. In this embodiment, the connection node 52(2) is directly connected to the port TR1. The capacitive element 56(2) is connected in shunt within respect to the main branch 48(2) of the RF filter path RFFP1(2). More specifically, the capacitive element 56(2) is directly connected to connection node 52(2) so that the capacitive element 56(2) shunts the connection node 52(2) to ground.

FIG. 9 also illustrates a circuit diagram of a RF filter path RFFP2(2) that is one embodiment of the RF filter path RFFP2 shown in FIG. 6. The RF filter path RFFP2(2) is an instance of the type described by the RF filter path RFFP(I)A shown in FIG. 6, where for the RF filter path RFFP2(2), X=2, Y=1, and Z=1 and such that the port ANT2 corresponds to the port 22 in FIG. 5 and such that the port TR2 corresponds to the port 24 shown in FIG. 5. Thus, the RF filter path RFFP2(2) shown in FIG. 9 includes a resonator 26A(2), a resonator 28A(2), a main branch 30A(2), a matching network 32A(2), a matching network 34A(2), a notch network 36A(2), a connection node 38A(2), a connection node 40(2), an inductor 42B(2), a capacitive element 44B(2), an inductor 42A(2), a capacitive element 44A(2) a node NR(26A)(2), a ground node G(26A)(2), a node NR(28A)(2), and a ground node G(28A)(2) that are embodiments of and correspond to the resonator 26A, the resonator 28A, the main branch 30, the matching network 32, the matching network 34, the notch network 36A, the connection node 38, the connection node 40, the inductor 42B, the capacitive element 44B, the inductor 42A, the capacitive element 44A the node NR(26), the ground node G(26), the node NR(28), the ground node G(28), respectively, of the RF filter path RFPP(I)A shown above with respect to FIG. 5.

Since X=2, the RF filter path RFFP2(2) shown in FIG. 9 includes an acoustic wave resonator AR1(2), which corresponds with the acoustic wave resonator AR1 described above with respect to FIG. 5, and includes an acoustic wave resonator AR2(2), which corresponds with the acoustic wave resonator ARX described above with respect to FIG. 5. Since Y=1 and Z=1, the notch network 36A(2) includes a capacitive element CN1(2), corresponding with the capacitive element CN1 described above with respect to FIG. 5, and an acoustic wave resonator AN1(2) which corresponds with the acoustic wave resonator AN1 described above with respect to FIG. 5. Thus, the notch network 36A(2) is a member of the subclass of notch networks described by the notch network NWC described above with respect to FIG. 4C.

In FIG. 9, the capacitive element CN1(2) is connected in series between the node NR(26A)(2) and the connection node 40(2). The capacitive element CN1(2) is connected in parallel with respect to the acoustic wave resonator AN1(2) and is connected in parallel to a portion of the main branch 30A(2) that is between the node NR26(2) and the connection node 40(2). However, the notch network 36A(2) does not include any other of the capacitive elements CN (described above with respect to FIG. 5) since Y=1. Also in FIG. 9, the acoustic wave resonator AN1(2) is connected in series between the node NR(26A)(2) and the connection node 40(2). The acoustic wave resonator AN1(2) is connected in parallel with respect to the capacitive element CN1(2) and is connected in parallel to the portion of the main branch 30A(2) that is between the node NR26(2) and the connection node 40(2). However, the notch network 36A(2) does not include any other of the capacitive elements AN.

Furthermore, since the notch network 36A(2) shown in FIG. 9 includes at least one of the acoustic wave resonators AN and at least one of the capacitive elements CN shown in FIG. 5, the notch network 36A(2) is the same type of notch network as the notch network NWC described above with respect to FIG. 4C.

In this embodiment, a matching network 32A(2) in FIG. 9 is an embodiment of the matching network 32 described above with respect to FIG. 2 and with respect to FIG. 5. Thus, in this embodiment, the matching network 32A(2) shown in FIG. 9 is connected within the main branch 30A(2) between the port ANT2 (which corresponds to the port 22 shown in FIG. 2 and in FIG. 5) and the node NR(26A)(2) (which corresponds to the node NR(26) in FIG. 2 and in FIG. 5). The matching network 32A(2) shown in FIG. 9 is configured to substantially match a source impedance seen by the RF filter path RFFP2(2) as seen at the port ANT2 to a path impedance at the node NR(26A)(2). The matching network 32A(2) shown in FIG. 9 only includes one capacitive element 72A(2). The capacitive element 72A(2) is connected in series within the main branch 30A(2) between the port ANT2 and the node NR(26A)(2).

A matching network 34A(2) in FIG. 9 is an embodiment of the matching network 34 described above with respect to FIG. 2 and with respect to FIG. 5. Thus, in this embodiment, the matching network 34A(2) shown in FIG. 9 is connected within the main branch 30A(2) between the node NR(28A)(2) (which corresponds to the node NR(28) in FIG. 2 and in FIG. 5) and the port TR2 (which corresponds to the port 24 shown in FIG. 2 and in FIG. 5). The matching network 34A(2) shown in FIG. 9 is configured to substantially match a path impedance seen at the node NR(28A)(2) to a load impedance seen by the RF filter path RFFP2(2) as seen at the port TR2. The matching network 34A(2) shown in FIG. 9 only includes one capacitive element 74A(2). The capacitive element 74A(2) is connected in series within the main branch 30A(2) between the node NR(28A)(2) and the port TR2.

FIG. 9 also illustrates a circuit diagram of a RF filter path RFFP3(2) that is one embodiment of the RF filter path RFFP3 shown in FIG. 6. The RF filter path RFFP3(2) is a member of the class of RF filters described by the RF filter path RFFP(I) shown in FIG. 2, but is not a member of the subclass of RF filter paths described by the RF filter path RFFP(I)A shown in FIG. 6. The RF filter path RFFP3(2) shown in FIG. 9 is thus connected to extend between the port ANT3 (which corresponds to the port 22 shown in FIG. 2) and the port TR3 (which corresponds with the port 24 shown in FIG. 2). The RF filter path RFFP3(2) has at least one pair of resonators 26B(2), 28B(2) that correspond to the pair of resonators 26, 28 described above in FIG. 2. The pair of resonators 26B(2), 28B(2) are thus coupled to the main branch 30B(2) in the same manner as that described above with respect to FIG. 2. Furthermore, the RF filter path RFFP3(2) includes a notch network 36B(2) that corresponds with the notch network 36 described above with respect to FIG. 2. The RF filter path RFFP3(2) also includes a matching network 32B(2) and a matching network 34B(2) that are connected within the main branch 30B(2) in the same manner described above with respect to FIG. 2. Thus, the RF filter path RFFP3(2) includes the nodes NR(26B)(2), NR(28B)(2), 38B(2), 40B(2) in the main branch 30B(2) and includes connections to the nodes NR(26B)(2), NR(28B)(2), 38B(2), 40B(2) in same manner as the RF filter path RFFP(I) described above with respect to FIG. 2.

However, the resonator 26B(2) is the type of resonator described by the resonator RB shown in FIG. 3B, where X=1. Thus, the resonator 26B(2) has an inductor 42A(266) (2) (that corresponds to the inductor 42B in FIG. 3B) and a capacitive element 44A(266)(2) (that corresponds to the capacitive element 44B in FIG. 3B), and an acoustic wave resonator AR1B(2) (that corresponds to the acoustic wave resonator AR1 in FIG. 3B). Furthermore, the node NR in FIG. 3B is the node NR(26B)(2) of the RF filter path RFFP3(2) shown in FIG. 9 and the node G shown in FIG. 3B is the node G(266)(2) of the RF filter path RFFP3(2) in FIG. 9.

As shown in FIG. 9, the RF filter path RFFP3(2) thus has the main branch 30B(2) that extends from the port ANT3 to the port TR3. The RF filter path RFFP3(2) also includes sub-branches coming off the main branch 30B(2). As explained in further detail below, the filtering components in the main branch 30B(2) and in the sub-branches coming off the main branch provide the desired response characteristics of the RF filter path RFFP3(2). To provide the roll-off necessary to create the passband within the transfer response between the port ANT3 and the port TR3, the RF filter path RFFP3(2) provides the resonator 26B(2) and the resonator 28B(2), both connected in shunt with respect to the RF filter path RFFP3(2). In this embodiment, the resonator 26B(2) is connected between the node NR(26B)(2) in the main branch 30B(2) and the grounded node G(266)(2) connected to ground. Accordingly, the resonator 26B(2) is connected in shunt to the main branch 30B(2) at node NR(26B)(2). The node NR(26B)(2) is provided in the main branch 30B(2). Also in this embodiment, the resonator 28B(2) is connected between the node NR(28B)(2) in the main branch 30B(2) and the grounded node G(286)(2) connected to ground. Accordingly, the resonator 28B(2) is connected in shunt to the main branch 30B(2) at node NR(28B)(2). The resonators 26B(2), 28B(2) in the RF filter path RFFP3(2) are configured such that a transfer response defines a passband. In this manner, RF signals that operate in frequency ranges within the passband propagate through the RF filter path RFFP3(2) between the port ANT3 and the port TR3.

The RF filter path RFFP3(2) has a transfer response that is defined between the port ANT3 and the port TR3. The resonators 26B(2), 28B(2) in the RF filter path RFFP3(2) are configured such that the transfer response defines the passband. More specifically, the resonators 26B(2), 28B(2) in the RF filter path RFFP3(2) are configured such that the transfer response defines the passband. As shown in FIG. 9, the RF filter path RFFP3(2) includes the matching network 32B(2) that is connected within the main branch 30B(2) between the port ANT3 and the node NR(28B)(2). The matching network 32B(2) is configured to provide an impedance transformation that provides impedance matching at the port ANT3 as explained in further detail below. The resonator 26B(2) is configured to resonate at a first frequency within the passband of the transfer response. In this manner, RF signals that operate in frequency ranges within the passband propagate through the RF filter path RFFP3(2) between the port ANT3 and the port TR3.

The RF filter path RFFP3(2) also includes the matching network 34B(2) that is connected within the main branch 30B(2) between the node NR(28B)(2) and the port TR3. The matching network 34B(2) is configured to provide an impedance transformation that provides impedance matching at the port TR3 as explained in further detail below. The resonator 28B(2) is configured to resonate at a second frequency within the passband of the transfer response. In this manner, RF signals that operate in frequency ranges within the passband propagate through the RF filter path RFFP3(2) between the port ANT3 and the port TR3.

As shown in FIG. 9, the RF filter path RFFP3(2) includes the notch network 36B(2) coupled to the main branch 30B(2) of the RF filter path RFFP3(2). The notch network 36B(2) is configured to define the stopband within the passband of the transfer response without substantially increasing ripple variation of the passband defined by the transfer response. Accordingly, although the notch network 36B(2) is coupled to the RF filter path RFFP3(2), the passband of the transfer response between the port ANT3 and the port TR3 is not substantially affected by the notch network 36B(2). Thus, the notch network 36B(2) is sufficiently isolated from the resonators 26B(2), 28B(2) so that interaction between the notch network 36B(2) and the resonators 26B(2), 28B(2) does not increase variation within the passband. More specifically, loading of the RF filter path RFFP3(2) by the notch network 36B(2) is so low that substantial rippling is not substantially created or substantially increased by the notch network 36B(2). Thus, insertion losses introduced by the notch network 36B(2) between the port ANT3 and the port TR3 are relatively small and constant within the passband of the transfer response. Nevertheless, by providing the stopband adjacent to the passband of the transfer response, the notch network 36B(2) sharpens the passband by increasing roll-off of the passband to the stopband.

In FIG. 9, the notch network 36B(2) shown in FIG. 1 is of the type described above by the notch network NWA shown in FIG. 4A, where Y=1. In this specific embodiment, the notch network 36B(2) includes a capacitive element CN1B(2) that corresponds to the capacitive element CN1 shown in FIG. 4A. In this embodiment, the capacitive element CN1B(2) is series connected between the connection node 38B(2) and the node NR(28B)(2), and the capacitive element CN1B(2) is connected in parallel with respect to a portion of the main branch 30B(2) between the connection node 38B(2) and the node NR(286)(2).

In this exemplary arrangement, the notch network 36B(2) is configured to dissipate RF signals within the stopband of the transfer response and thereby prevent RF signals within the stopband from propagating between the port ANT3 and the port TR3 or through the RF filter path RFFP3(2). Dissipating the RF signals usually moderates the depth of the stopband and reduces flyback, thereby ensuring more isolation with respect to the passband and RF communication bands outside the stopband. The notch network 36B(2) also increases roll-off necessary to create the passband within the transfer response between the port ANT3 and the port TR3 so that the passband is isolated from the passband of other RF filter paths. To provide the roll-off necessary to create the passband within the transfer response between the port ANT3 and the port TR3, the RF filter path RFFP3(2) provides the resonator 26B(2) and the resonator 28B(2), both connected in shunt with respect to the RF filter path RFFP3(2).

In this embodiment, a matching network 32B(2) in FIG. 9 is an embodiment of the matching network 32 described above with respect to FIG. 2. Thus, in this embodiment, the matching network 32B(2) shown in FIG. 9 is connected within the main branch 30B(2) between the port ANT3 (which corresponds to the port 22 shown in FIG. 2) and the node NR(26B)(2) (which corresponds to the node NR(26) in FIG. 2). The matching network 32B(2) shown in FIG. 9 is configured to substantially match a source impedance seen by the RF filter path RFFP3B(2) as seen at the port ANT3 to a path impedance at the node NR(26B)(2). The matching network 32B(2) shown in FIG. 9 only includes one capacitive element 72B(2). The capacitive element 72B(2) is connected in series within the main branch 30B(2) between the port ANT3 and the node NR(26B)(2).

A matching network 34B(2) in FIG. 9 is an embodiment of the matching network 34 described above with respect to FIG. 2. Thus, in this embodiment, the matching network 34B(2) shown in FIG. 9 is connected within the main branch 30B(2) between the node NR(28B)(2) (which corresponds to the node NR(28) in FIG. 2) and the port TR3 (which corresponds to the port 24 shown in FIG. 2). The matching network 34B(2) shown in FIG. 9 is configured to substantially match a path impedance seen at the node NR(28B)(2) to a load impedance seen by the RF filter path RFFP3B(2) as seen at the port TR3. The matching network 34B(2) shown in FIG. 9 only includes one capacitive element 74B(2). The capacitive element 74B(2) is connected in series within the main branch 30B(2) between the node NR(28B)(2) and the port TR3.

Figure 10:
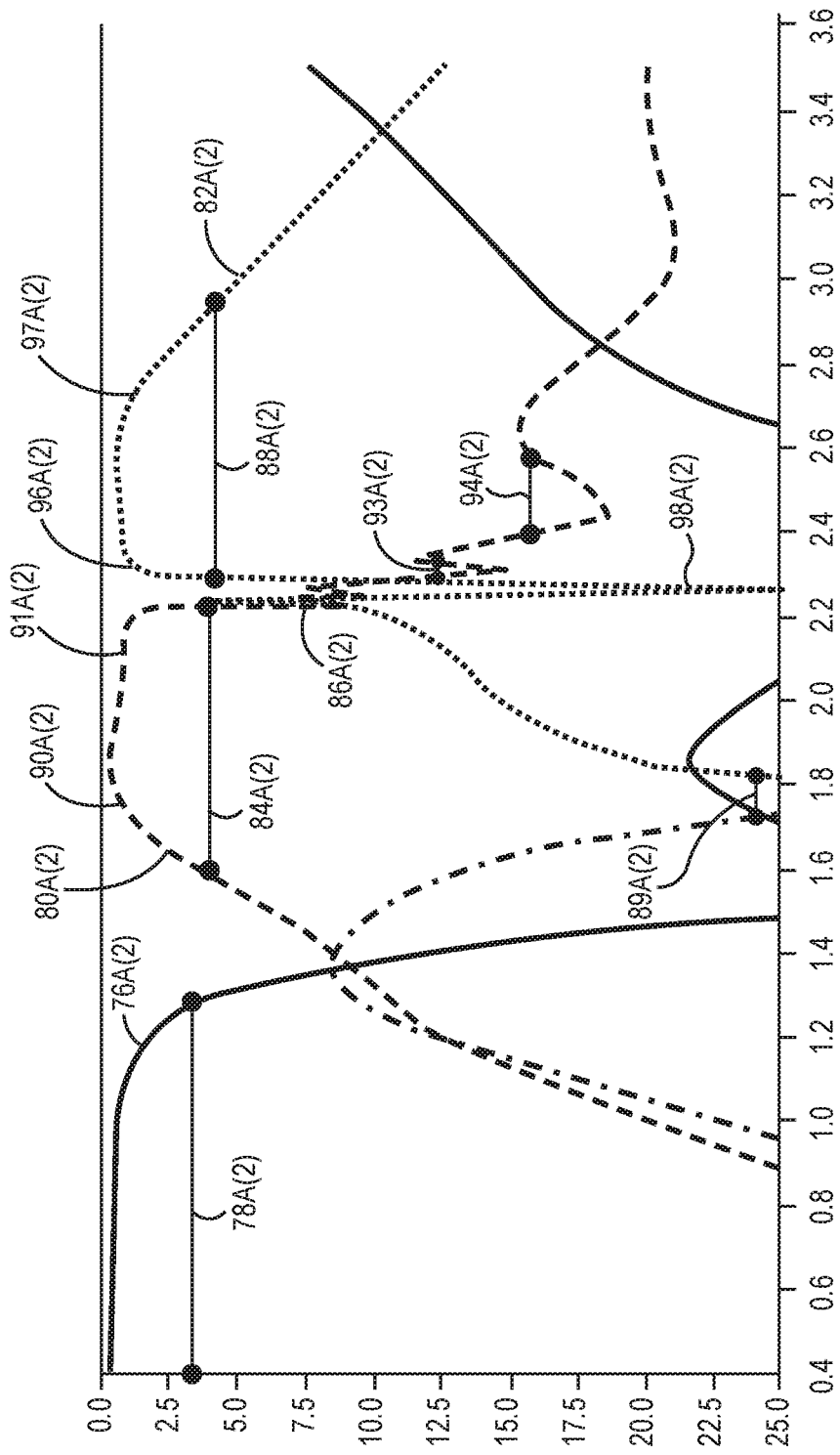
FIG. 10 illustrates the transfer responses of the RF filter structure shown in FIG. 9.

FIG. 10 illustrates an example of the first transfer function 76A(2) provided by the RF filter path RFFP1(2) between the port ANT1 and the port TR1. The RF filter path RFFP1(2) shown in FIG. 1 is configured to provide a first passband 78A(2) in the first filter response of the RF filter structure 12A(2) between the port ANT1 and the port TR1. As shown in FIG. 10, the RF filter path RFFP1(2) has been tuned to operate as a low pass filter so that the first passband 78A(2) passes all frequencies between at least 0.4 GHz to 1.5 GHz. Since the RF filter path RFFP1(2) provides low pass filtering, the first passband 78A(2) of the first transfer function 76A(2) may not have a low edge frequency provided 3 dB below the maximum or average maximum of the first transfer function 76A(2) within the first passband 78A(2). Instead, the first passband 78A(2) simply continues to the frequency of 0 GHz, which thereby provides the low edge frequency of the first passband 78A(2). The first passband 78A(2), however, does have a 3 dB point below the maxima or the average maxima of the first passband 78A(2), which in this case is provided at around 1.4 GHz. Therefore, the center frequency of the first passband 78A(2) is provided at approximately 0.7 GHz.

FIG. 10 also shows an embodiment of a second transfer response 80A(2) of the RF filter path RFFP2(2) between the port ANT2 and the port TR2. Furthermore, FIG. 10 also shows an embodiment of a third transfer response 82A(2) of the RF filter path RFFP3(2) between the port ANT3 and the port TR3. The second transfer response 80A(2) of the RF filter path RFFP2(2) defines a passband 84A(2), a stopband 86A(2), and a stopband 94A(2) between the port ANT2 and the port TR2. Furthermore, the third transfer response 82A(2) of the RF filter path RFFP3(2) defines a passband 88A(2) and a stopband 89A(2) between the port ANT3 and the port TR3.

With respect to the RF filter path RFFP1(2) that provides the first passband 78A(2) in the first transfer response 76A(2) shown in FIG. 10, the RF filter path RFFP1(2) can be provided as a low pass filter where the first passband is defined from a frequency of zero to a high edge frequency defined by a three dB point, as mentioned above. To provide adequate roll-off for the first passband and to prevent insertion losses from the RF filter path RFFP1, the parallel resonator 60(2) and the series resonator 58(2) are each tuned so that the transfer response 76A(2) remains below 20 dB from 1.3 GHz through 2.9 GHz and thereby provides adequate isolation.

With regards to the second transfer response 80A(2) between the port ANT2 and the port TR2 provided by the RF filter path RFFP2(2) of the RF filtering circuitry 12A(2) shown in FIG. 9, the second transfer response 80A(2) defines an embodiment of the second passband 84A(2) and the stopband 86A(2). The second passband 84A(2) of the second transfer response 80A(2) has a center frequency of approximately 1.8 GHz along with a local maxima 90A(2), and a local maxima 91A(2). The local maxima 90A(2) is provided by the parallel resonator 28A(2) of the RF filter path RFFP2(2) wherein the parallel resonator 28A(2) is configured to resonate at the frequency of approximately 1.7 GHz, where the frequency provides correspondence to the location of the local maxima 90A(2), which is within the second passband 84A(2) but greater than the center frequency of 1.8 GHz. The second transfer response 80A(2) also includes the other local maxima 91A(2) at the frequency of 2.1 GHz, which is below the center frequency 1.8 GHz. The local maxima 91A(2) is created by the parallel resonator 26A(2), which is configured to resonate at a frequency of approximately 2.1 GHz within the second passband 84A(2).

The stopband 86A(2) of the second transfer response 80A(2) is located adjacent to the second passband 84A(2) of the second transfer response 80A(2). The stopband 86A(2) is created by the acoustic wave resonators AR1(2), AR2(2) in the parallel resonator 26(2) of the RF filter path RFFP2(2), which each create a different notch in the stopband 86A(2). The stopband 94A(2) is created by the acoustic wave resonator AN1(2) in the notch network 36A(2) of the RF filter path RFFP2(2). In this embodiment, the stopband 86A(2) is provided by the three dB points that are higher than the average of between the local minima provided by the acoustic wave resonators AR1(2) and AR2(2). The stopband 86A(1) has a center frequency of approximately 2.25 GHz.

As mentioned above, the third transfer response 82A(2) of the RF filter path RFFP3(2) defines the passband 88A(2), the stopband 89A(2), and the stopband 98A(2) between the port ANT3 and the port TR3. The third passband 88A(2) of the third transfer response 82A(2) has a center frequency of approximately 2.45 GHz along with a local maxima 96A(2), and a local maxima 97A(2). The local maxima 96A(2) is provided by the parallel resonator 26B(2) of the RF filter path RFFP3(2), wherein the parallel resonator 26B(2) is configured to resonate at the frequency of approximately 2.32 GHz where the frequency provides correspondence to the location of the local maxima 96A(2), which is within the second passband 84A(2) but greater than the center frequency of 2.25 GHz. The local maxima 97A(2) is provided by the parallel resonator 28B(2) of the RF filter path RFFP3(2), wherein the parallel resonator 26B(2) is configured to resonate at the frequency of approximately 2.7 GHz, where the frequency provides correspondence to the location of the local maxima 97A(2).

The stopband 89A(2) of the third transfer response 82A(2) is located adjacent to the third passband 88A(2) of the third transfer response 82A(2) and is a notch 89A(2). The notch 93A(2) is created by the capacitor CN1(13)(2). In this embodiment, the stopband 89A(2) is provided by the 3 dB points that are higher than the local minima provided by the weak coupling at 1.7 GGHz. Also, the inductor 42B(2) is weakly coupled to the inductor 42A(266)(2) and the inductor 42A(2) is weakly coupled to the inductor 42A(286)(2). This maintains the third transfer response below 12.5 dB for most of the remainder of the span of the second passband 84A(2). Furthermore, the stopband 98A(2) has a center frequency of around 2.3 GHz and is created by the acoustic wave resonator AR1(B)(2) in the parallel resonator 26B(2), shown in FIG. 9.

The concepts utilized in FIG. 1-FIG. 9 can also be used to construct the RF front end circuitry or for any multiplexing scheme so long as isolation and insertion losses can be maintained within limits. Furthermore, the concepts can be used to route RF signals to additional antennas. These concepts therefore can be used to construct multiplexers with any degree of multiplexing including quadplexers, sextaplexers, septaplexers, etc.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) filtering circuitry comprising:
a common port;
a second port;
a third port;
a first RF filter path connected between the common port and the second port, wherein the first RF filter path comprises a first pair of resonators and a first acoustic wave resonator wherein:
the first pair of resonators comprises a first parallel resonator and a second parallel resonator, and the first parallel resonator comprises a second acoustic wave resonator, wherein the second acoustic wave resonator is configured to increase roll-off at a first edge of a first passband; and
the first acoustic wave resonator is series connected between the first parallel resonator and the second parallel resonator; and
a second RF filter path connected between the common port and the third port, wherein the second RF filter path comprises a second pair of resonators comprising a third parallel resonator and a fourth parallel resonator.

2. The RF filtering circuitry of claim 1 wherein the first parallel resonator and the second parallel resonator are configured so that the first RF filter path defines a first transfer response with the first passband between the common port and the second port.

3. The RF filtering circuitry of claim 2 wherein the third parallel resonator and the fourth parallel resonator are configured so that the second RF filter path defines a second transfer response with a second passband between the common port and the third port.

4. The RF filtering circuitry of claim 3 wherein the first acoustic wave resonator is configured to create a first stopband in the first transfer response that is between the first passband of the first transfer response and the second passband of the second transfer response.

5. The RF filtering circuitry of claim 4 wherein the first stopband is a first notch.

6. The RF filtering circuitry of claim 4 wherein:
the first parallel resonator and the second parallel resonator are mutually coupled;
the third parallel resonator and the fourth parallel resonator are mutually coupled.

7. The RF filtering circuitry of claim 6 wherein the first parallel resonator is configured to resonate at a first resonant frequency within the first passband, the second parallel resonator is configured to resonate at a second resonant frequency within the first passband, the third parallel resonator is configured to resonate at a third resonant frequency within the second passband, and the fourth parallel resonator is configured to resonate at a fourth resonant frequency within the second passband.

8. The RF filtering circuitry of claim 7 wherein the first acoustic wave resonator is configured to resonate approximately at the first resonant frequency, and the second acoustic wave resonator is configured to resonate at a fifth resonant frequency between the first resonant frequency and the third resonant frequency.

9. The RF filtering circuitry of claim 8 wherein the first resonant frequency is lower than the second resonant frequency, the second resonant frequency is lower than the third resonant frequency, and the third resonant frequency is lower than the fourth resonant frequency.

10. The RF filtering circuitry of claim 8 wherein the first parallel resonator and the third parallel resonator are coupled to the common port.

11. The RF filtering circuitry of claim 10 wherein the second parallel resonator is coupled to the second port.

12. The RF filtering circuitry of claim 11 wherein the fourth parallel resonator is coupled to the third port.

13. The RF filtering circuitry of claim 12 wherein:
the first parallel resonator further comprises a first inductor and a first capacitive element, wherein the first inductor, the first capacitive element, and the second acoustic wave resonator are connected in parallel;
the second parallel resonator comprises a second inductor and a second capacitive element that are connected in parallel.

14. The RF filtering circuitry of claim 13 wherein:
the third parallel resonator comprises a third inductor and a third capacitive element that are connected in parallel;
the fourth parallel resonator comprises a fourth inductor and a fourth capacitive element that are connected in parallel.

15. The RF filtering circuitry of claim 14 wherein the second RF filter path comprises a second main branch connected between the common port and the third port, and wherein the third parallel resonator and the fourth parallel resonator are connected in shunt with respect to the second main branch.

16. The RF filtering circuitry of claim 15 wherein the first parallel resonator further comprises a third acoustic wave resonator connected in parallel with the second acoustic wave resonator, the first inductor, and the first capacitive element.

17. The RF filtering circuitry of claim 16 wherein the third parallel resonator further comprises a fourth acoustic wave resonator connected in parallel with the third inductor and the third capacitive element.

18. The RF filtering circuitry of claim 4 further comprising a third RF filter path and a fourth port, wherein the third RF filter path is coupled between the common port and the fourth port.

19. The RF filtering circuitry of claim 18 wherein the third RF filter path is configured to define a third transfer response with a third passband between the common port and the fourth port, and wherein the third passband is in a lower frequency range than the first passband and the second passband.

* * * * *

UNITED STATES PATENT AND TRADEMARK OFFICE
CERTIFICATE OF CORRECTION

PATENT NO. : 10,284,178 B2
APPLICATION NO. : 15/449357
DATED : May 7, 2019
INVENTOR(S) : Dirk Robert Walter Leipold et al.

Page 1 of 1

It is certified that error appears in the above-identified patent and that said Letters Patent is hereby corrected as shown below:

In the Specification

In Column 18, Line 31, replace "42A(266)(1)" with --42A(26B)(1)--.
In Column 18, Line 33, replace "44A(266)(1)" with --44A(26B)(1)--.
In Column 18, Line 41, replace "42A(286)" with --42A(28B)--.
In Column 18, Line 43, replace "44A(286)(1)" with --44A(28B)(1)--.
In Column 22, Line 27, replace "42A(266)(1)" with --42A(26B)(1)--.
In Column 22, Line 28, replace "42A(286)(1)" with --42A(28B)(1)--.
In Column 25, Line 35, replace "42A(266)" with --42A(26B)--.
In Column 25, Line 37, replace "44A(266)(2)" with --44A(26B)(2)--.
In Column 25, Lines 43 and 59, replace "G(266)(2)" with --G(26B)(2)--.
In Column 25, Line 65, replace "G(286)(2)" with --G(28B)(2)--.
In Column 27, Line 3, replace "NR(286)(2)" with --NR(28B)(2)--.
In Column 29, Line 23, replace "CN1(13)(2)" with --CN1(B)(2)--.
In Column 29, Line 27, replace "42A(266)(2)" with --42A(26B)(2)--.
In Column 29, Line 28, replace "42A(286)(2)" with --42A(28B)(2)--.

Signed and Sealed this
Twenty-fifth Day of June, 2019

Andrei Iancu
*Director of the United States Patent and Trademark Office*